US012019462B2

(12) United States Patent
Hashimoto et al.

(10) Patent No.: US 12,019,462 B2
(45) Date of Patent: Jun. 25, 2024

(54) CONSTANT VOLTAGE CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toru Hashimoto, Yokohama Kanagawa (JP); Akio Ogura, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 190 days.

(21) Appl. No.: 17/692,653

(22) Filed: Mar. 11, 2022

(65) Prior Publication Data
US 2023/0088617 A1    Mar. 23, 2023

(30) Foreign Application Priority Data

Sep. 22, 2021  (JP) ................. 2021-154698

(51) Int. Cl.
G05F 1/575   (2006.01)
G05F 1/56    (2006.01)
H03G 3/30    (2006.01)

(52) U.S. Cl.
CPC ............ *G05F 1/575* (2013.01); *G05F 1/561* (2013.01); *H03G 3/30* (2013.01)

(58) Field of Classification Search
CPC . G05F 1/56; G05F 1/561; G05F 1/565; G05F 1/575; H03G 3/30
See application file for complete search history.

(56) References Cited

U.S. PATENT DOCUMENTS

| 5,986,910 A * | 11/1999 | Nakatsuka | ............. G05F 1/561 |
| | | | 363/73 |
| 2012/0187927 A1* | 7/2012 | Yu | ............. G05F 1/575 |
| | | | 323/271 |

(Continued)

FOREIGN PATENT DOCUMENTS

| JP | 2006-079517 A | 3/2006 |
| JP | 4389681 B2 | 12/2009 |

(Continued)

OTHER PUBLICATIONS

Notice of Reasons for Refusal mailed May 7, 2024 in corresponding Japanese Patent Application No. 2021-154698, 8 pages (with Translation).

*Primary Examiner* — Gary L Laxton
(74) *Attorney, Agent, or Firm* — Kim & Stewart LLP

(57) ABSTRACT

According to one embodiment, a constant voltage circuit includes: a first gain stage configured to output a first voltage amplified based on an output voltage and a reference voltage; a first transistor configured to control the output voltage based on the first voltage; a second transistor configured to control a current that flows through the first gain stage; a first circuit configured to convert an amount of fluctuation in the output voltage into a first current; and a second circuit configured to control a gate voltage of the second transistor based on the first current. A third current or a fourth current greater than the third current flows through the first gain stage based on the gate voltage of the second transistor.

13 Claims, 28 Drawing Sheets

(56) References Cited

U.S. PATENT DOCUMENTS

| | | | |
|---|---|---|---|
| 2013/0320942 A1* | 12/2013 | Vemula | ................... G05F 1/573 |
| | | | 323/265 |
| 2015/0171731 A1 | 6/2015 | Tomioka et al. | |
| 2015/0227147 A1* | 8/2015 | Ivanov | ................... G05F 1/575 |
| | | | 323/280 |
| 2017/0220059 A1 | 8/2017 | Kadowaki | |
| 2018/0224876 A1 | 8/2018 | Ogura | |
| 2023/0015014 A1 | 1/2023 | Ogura | |

FOREIGN PATENT DOCUMENTS

| | | |
|---|---|---|
| JP | 2015-118452 A | 6/2015 |
| JP | 2017-134743 A | 8/2017 |
| JP | 2018-128868 A | 8/2018 |
| JP | 6510165 B2 | 5/2019 |
| JP | 2023-013178 A | 1/2023 |

\* cited by examiner

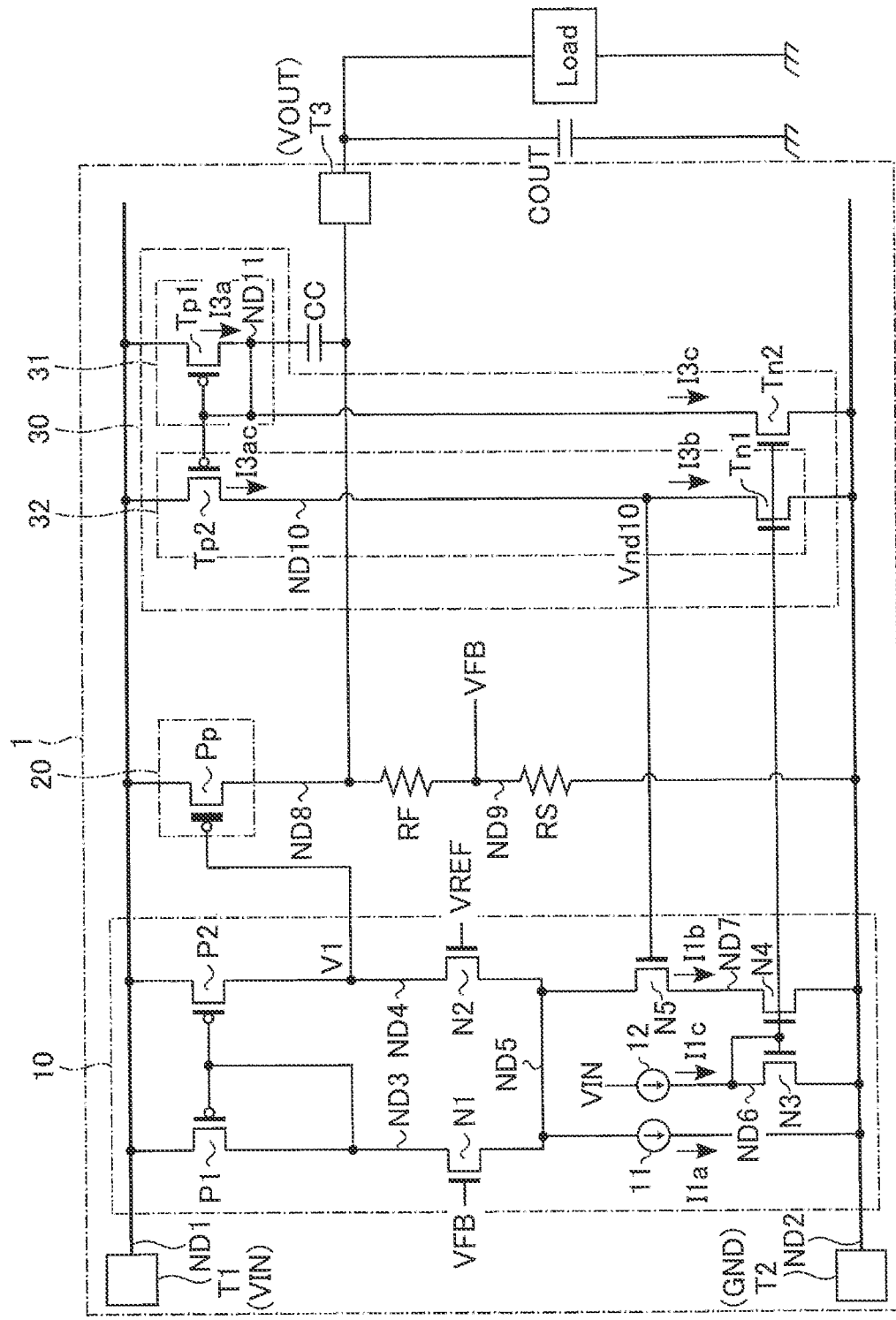
F I G. 1

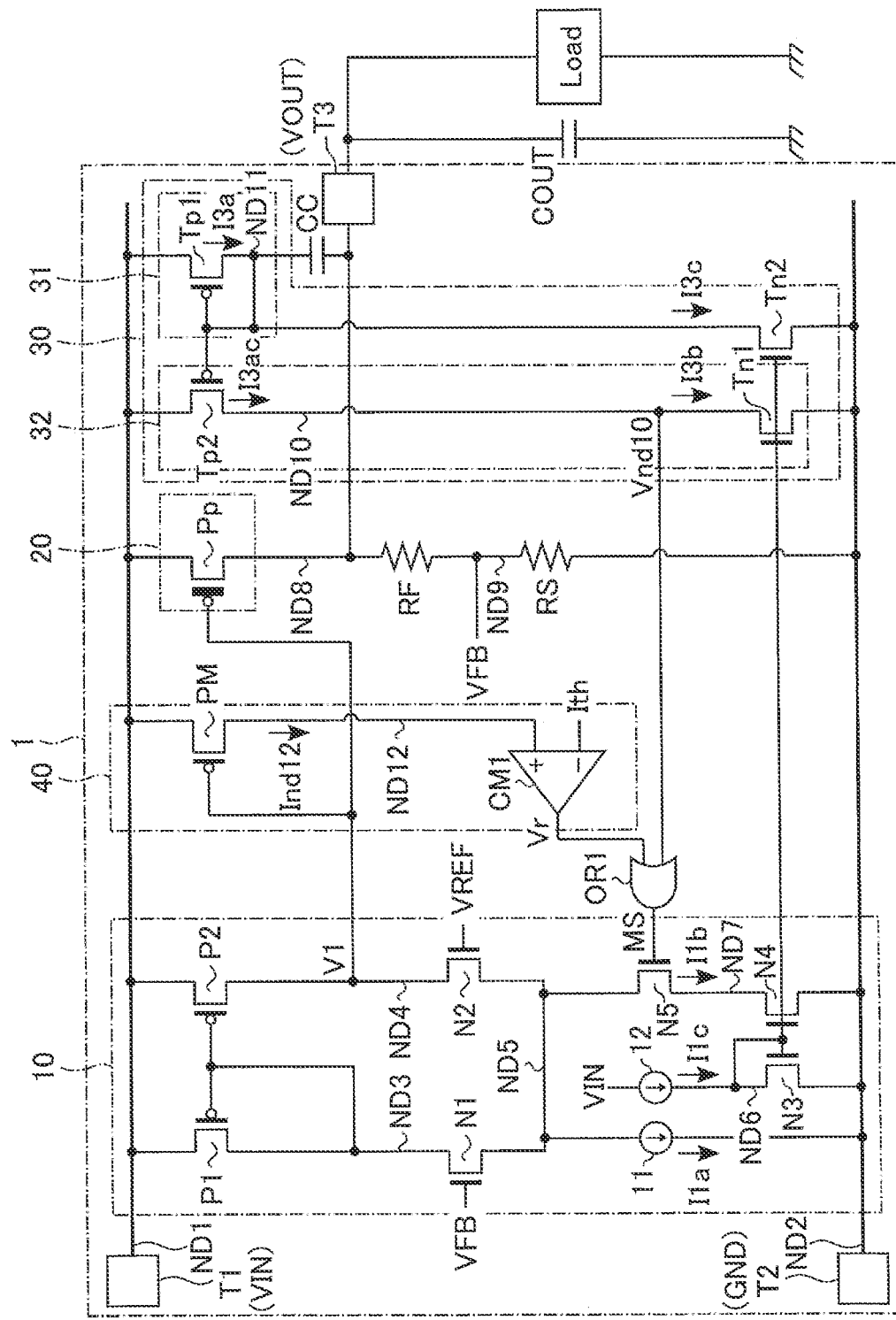
F I G. 5

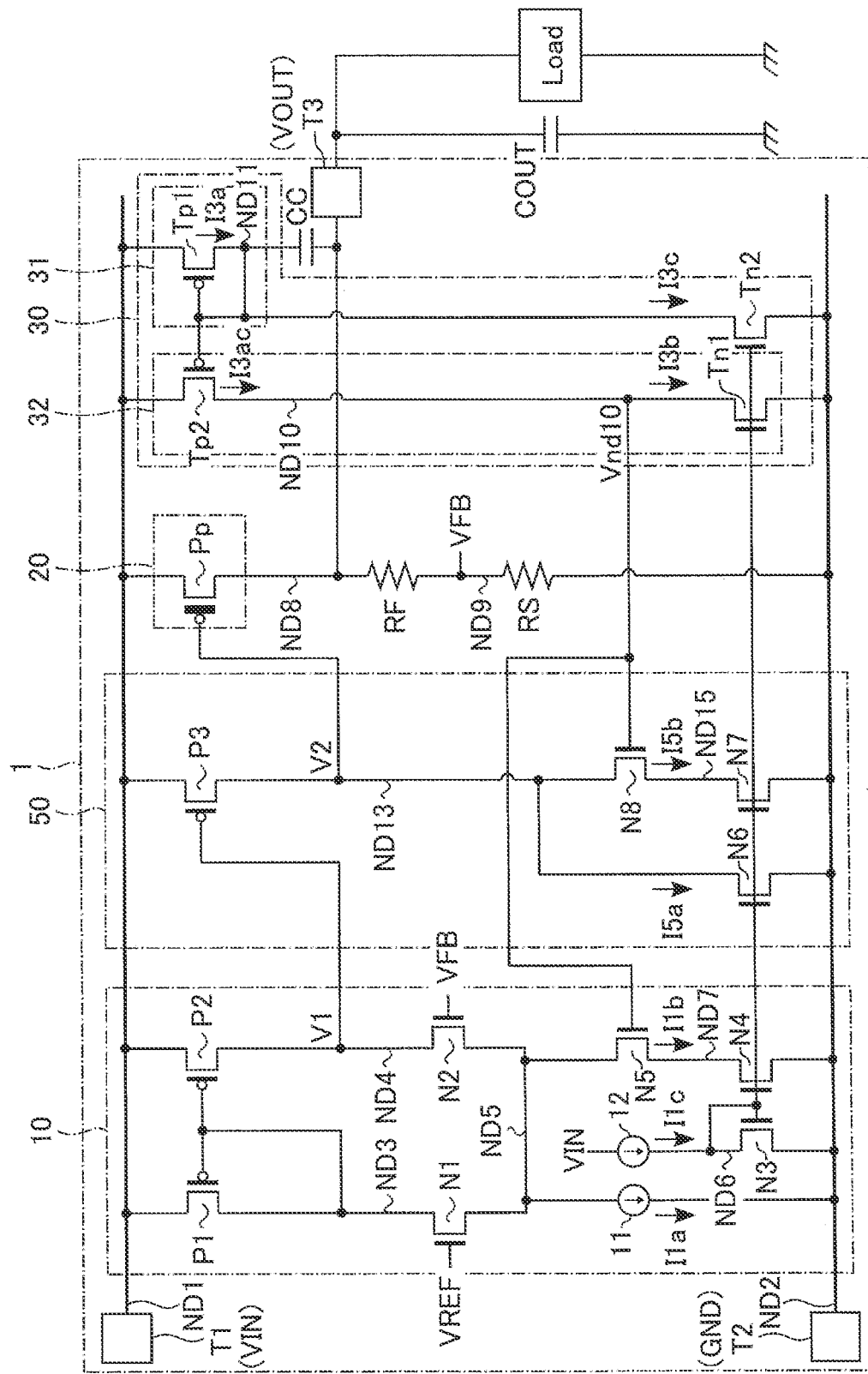
F I G. 8

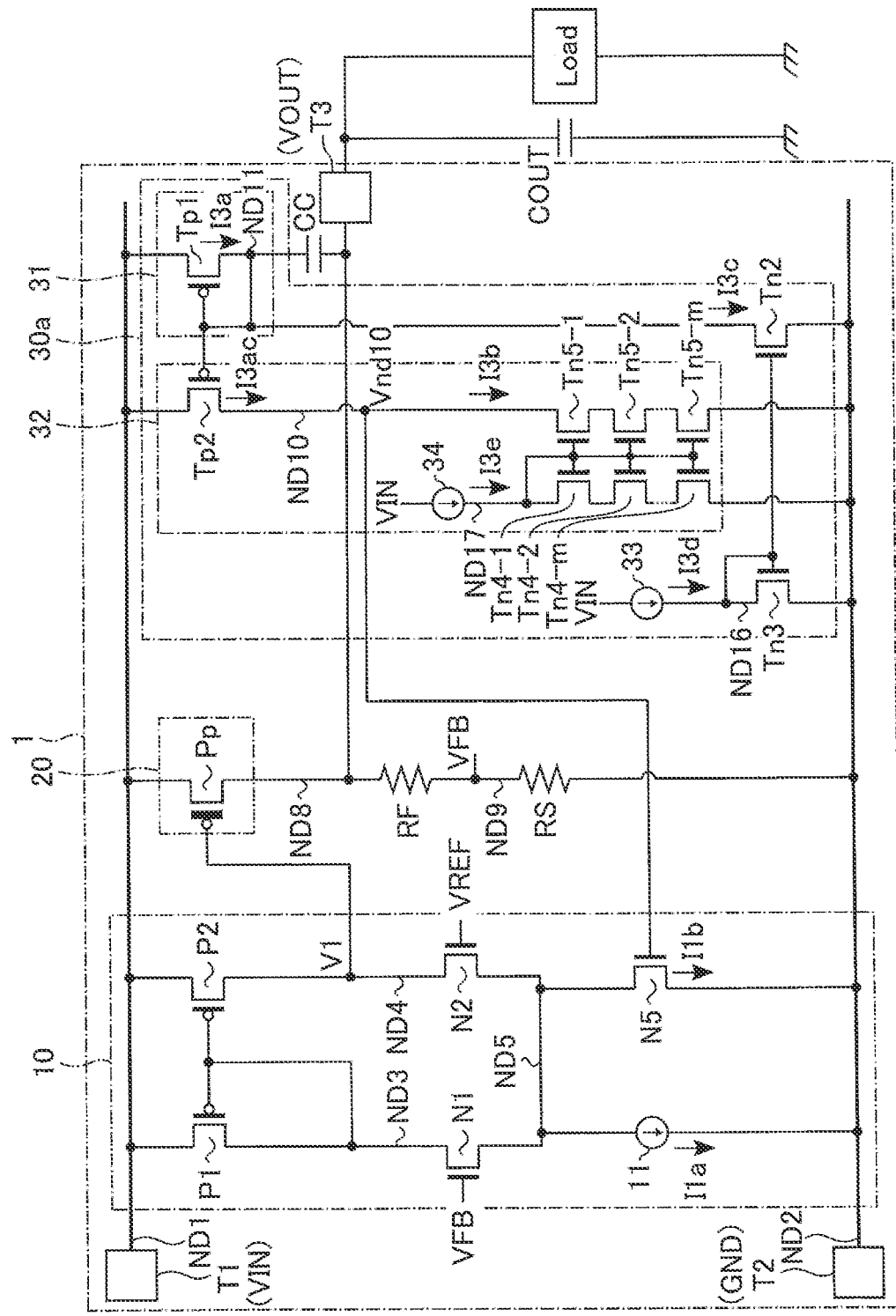
F I G. 9

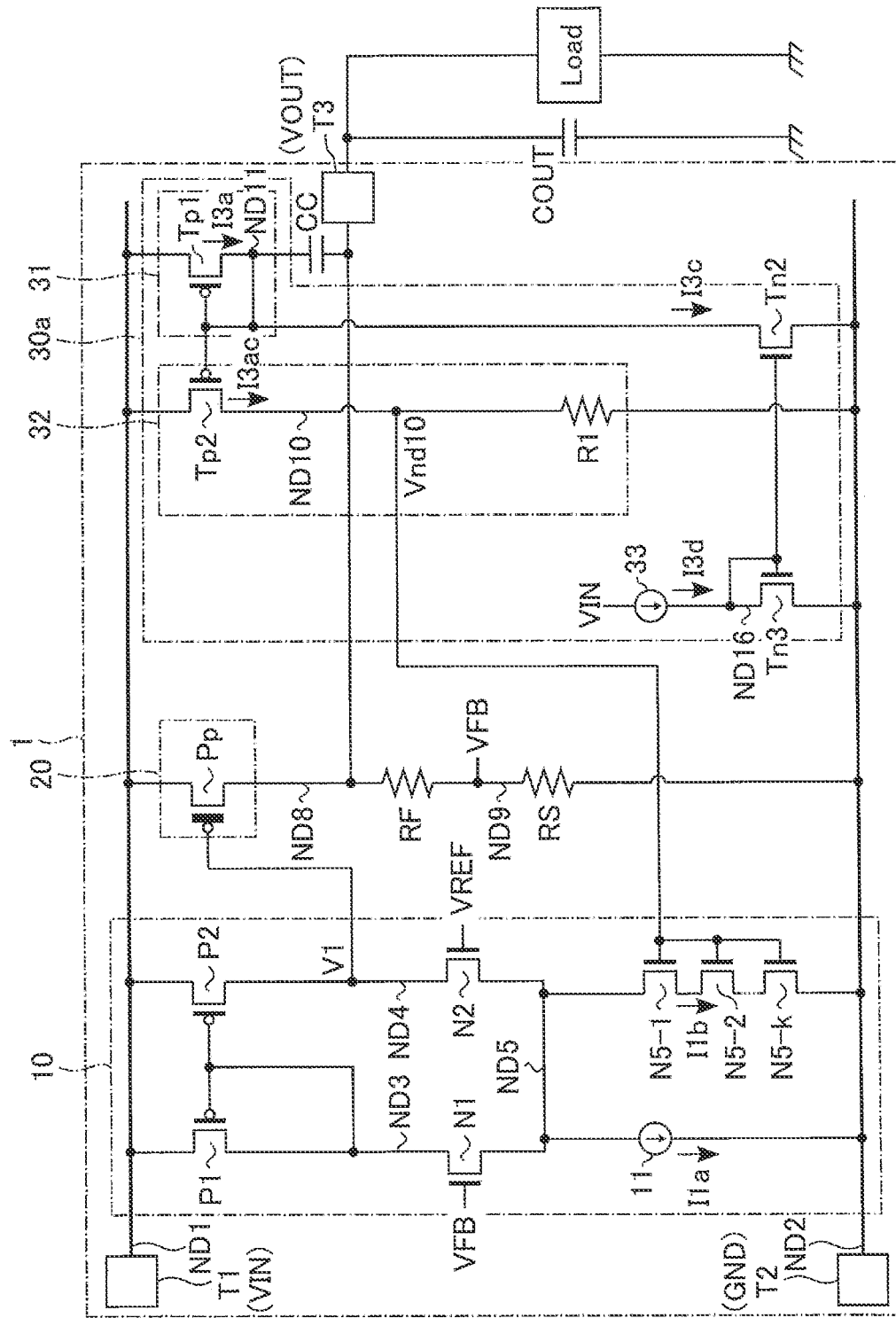
F I G. 12

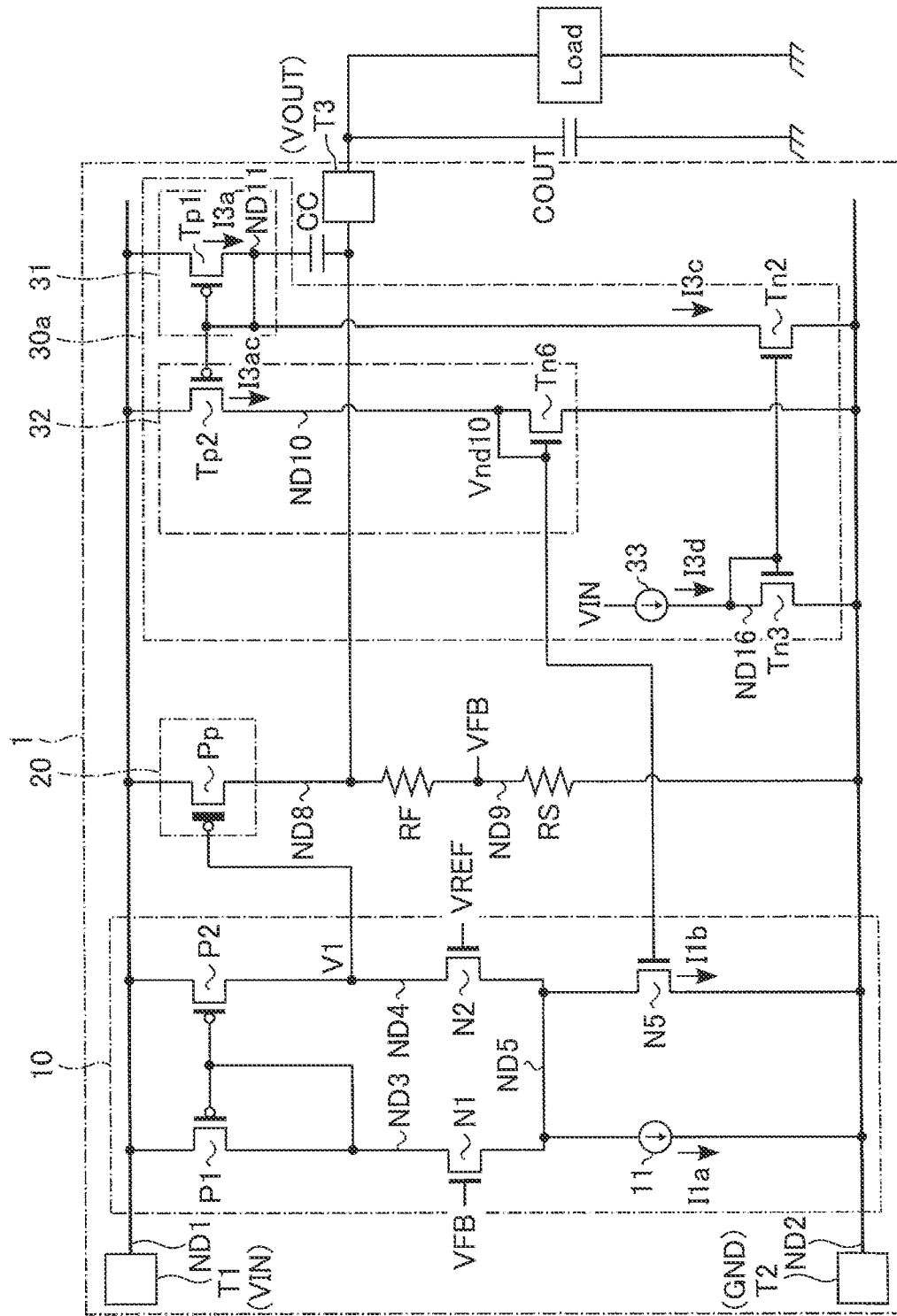
F I G. 13

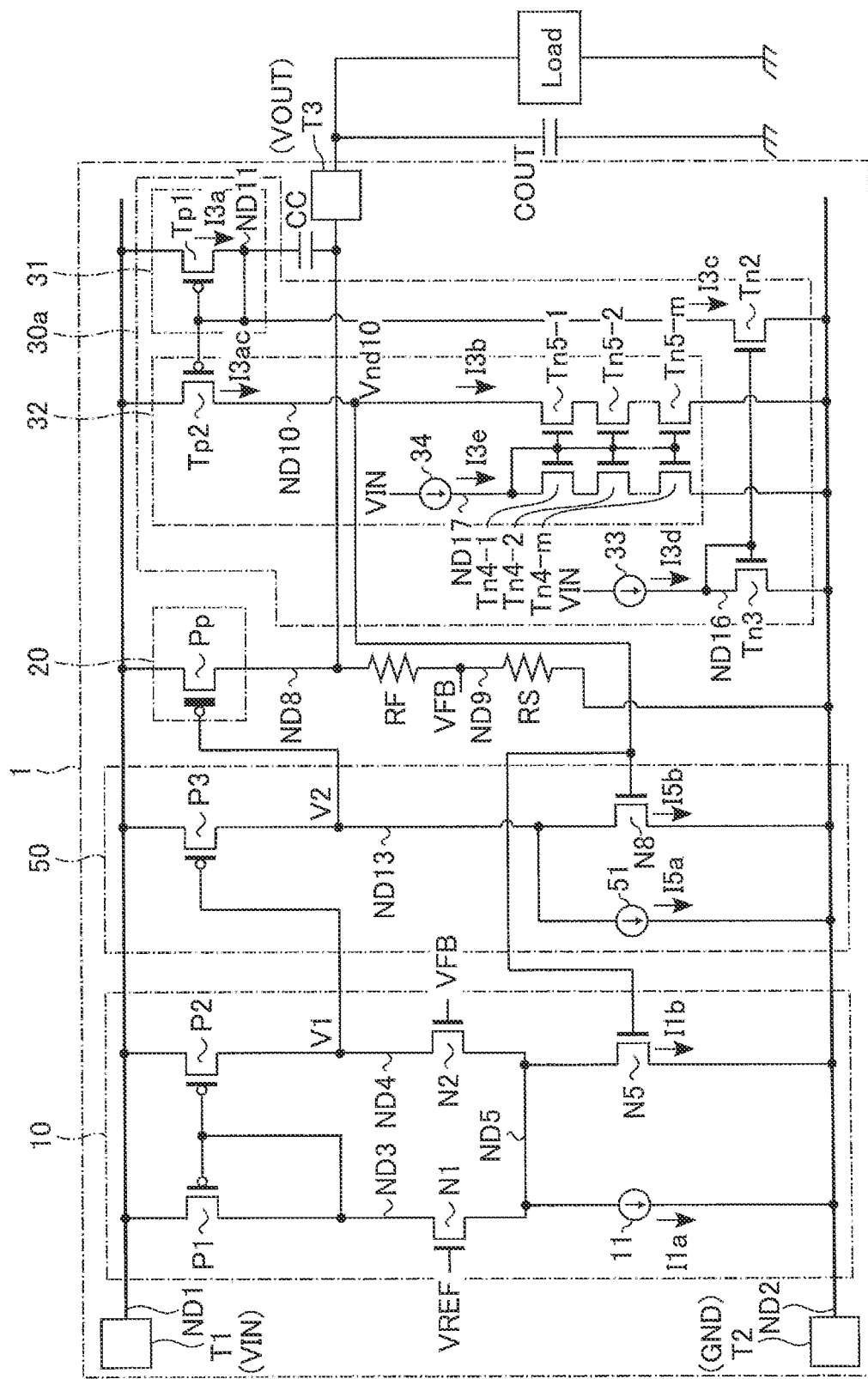
F I G. 14

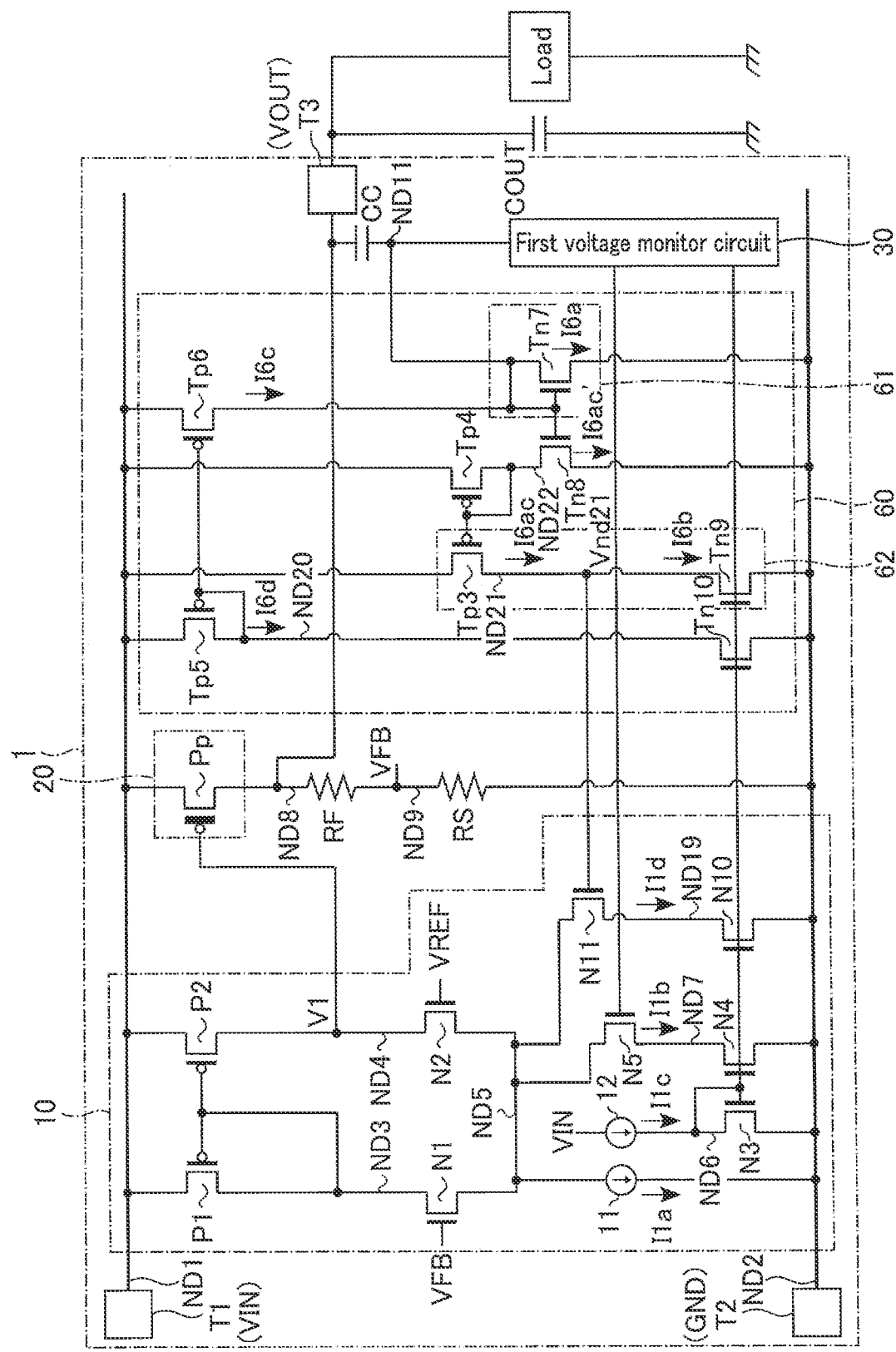
F I G. 15

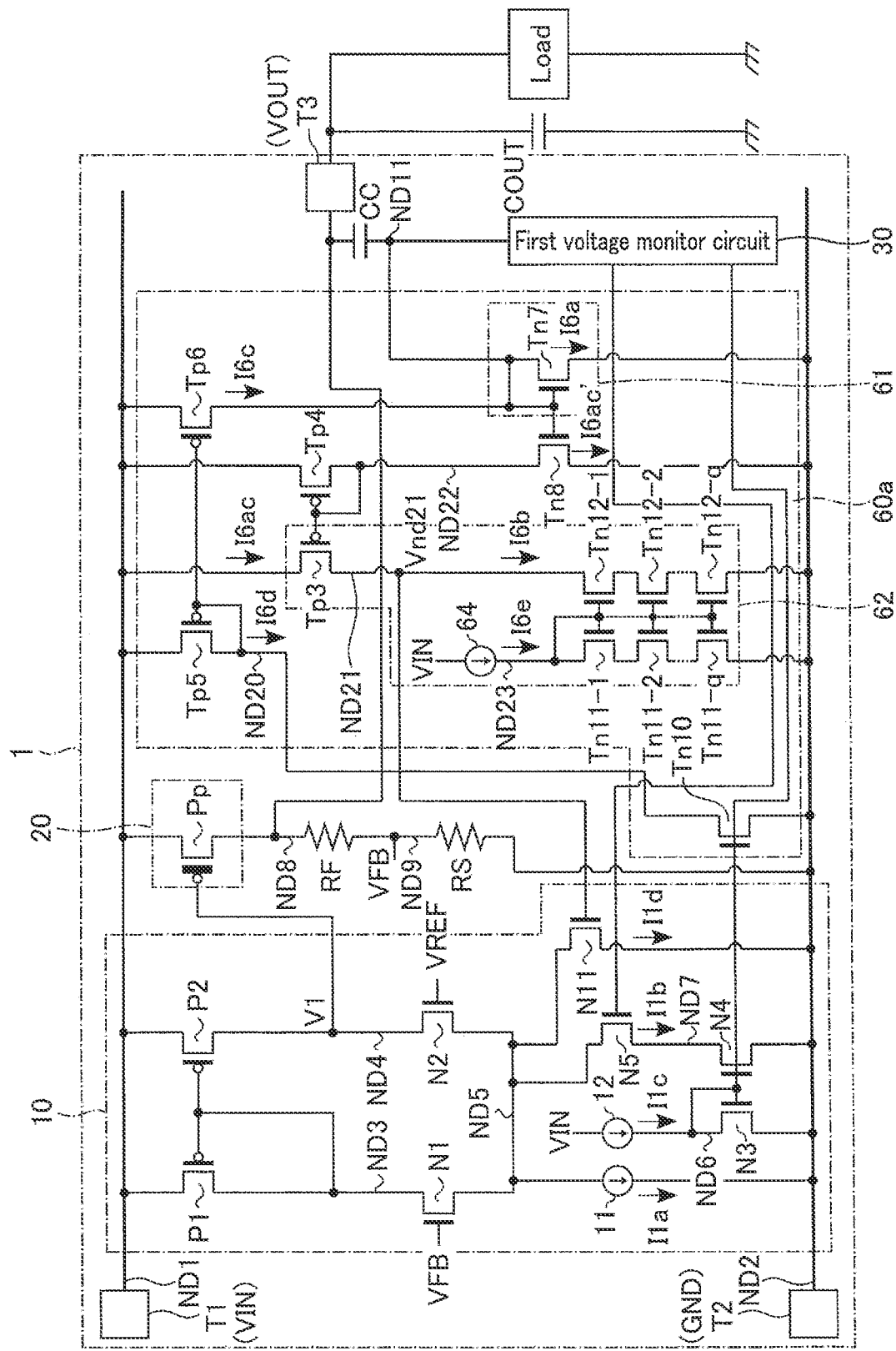
F I G. 19

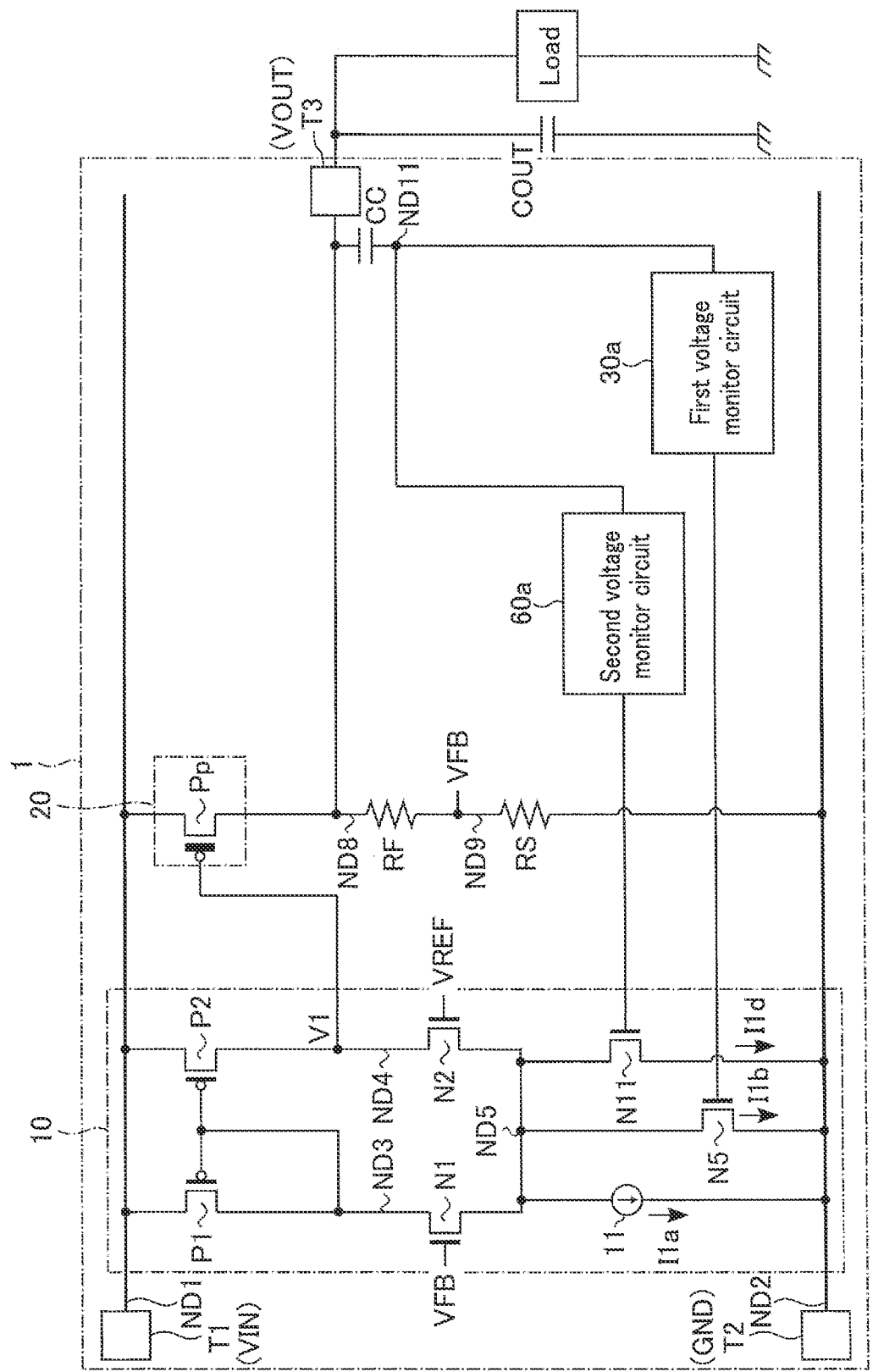
F I G. 20

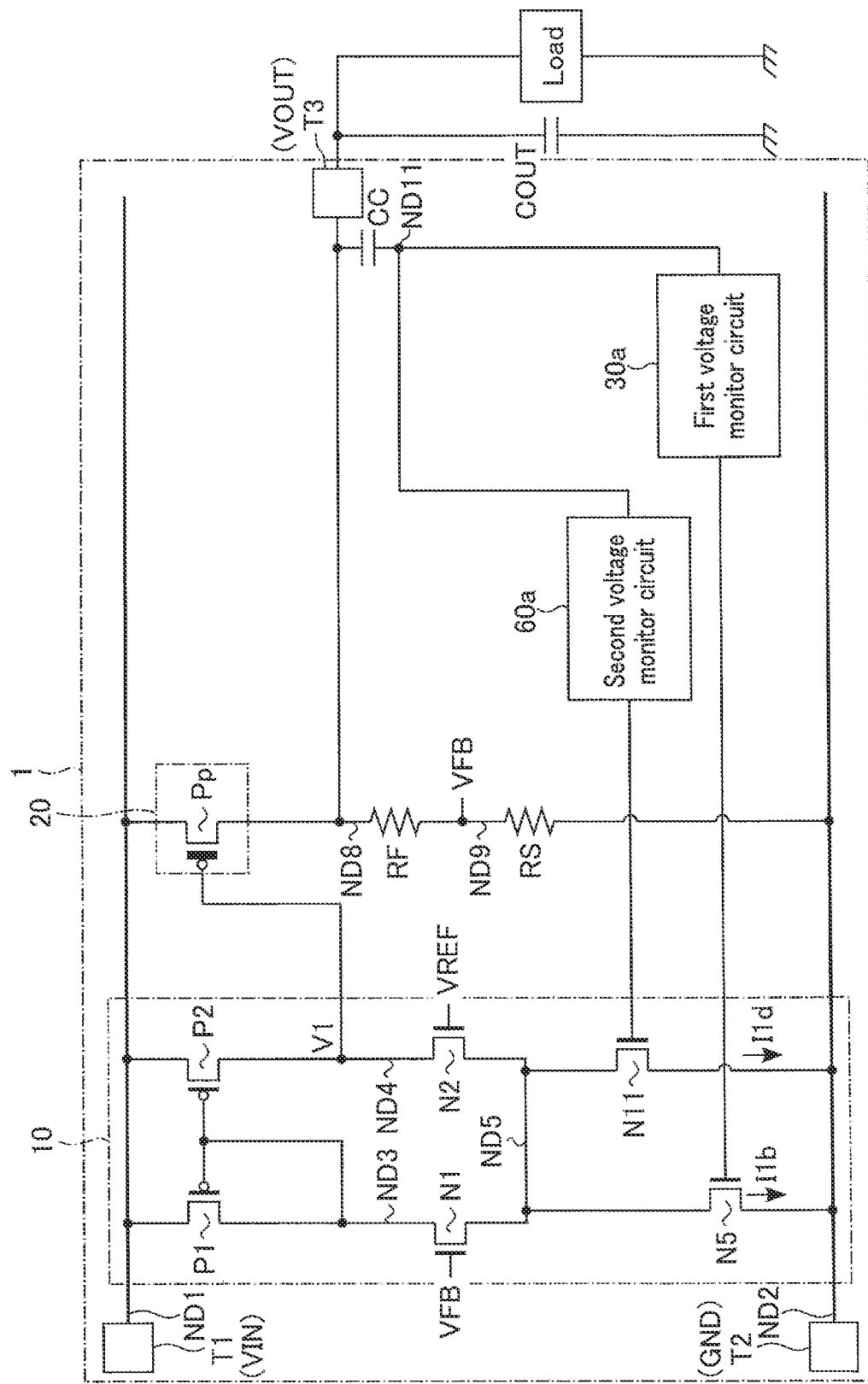
F I G. 21

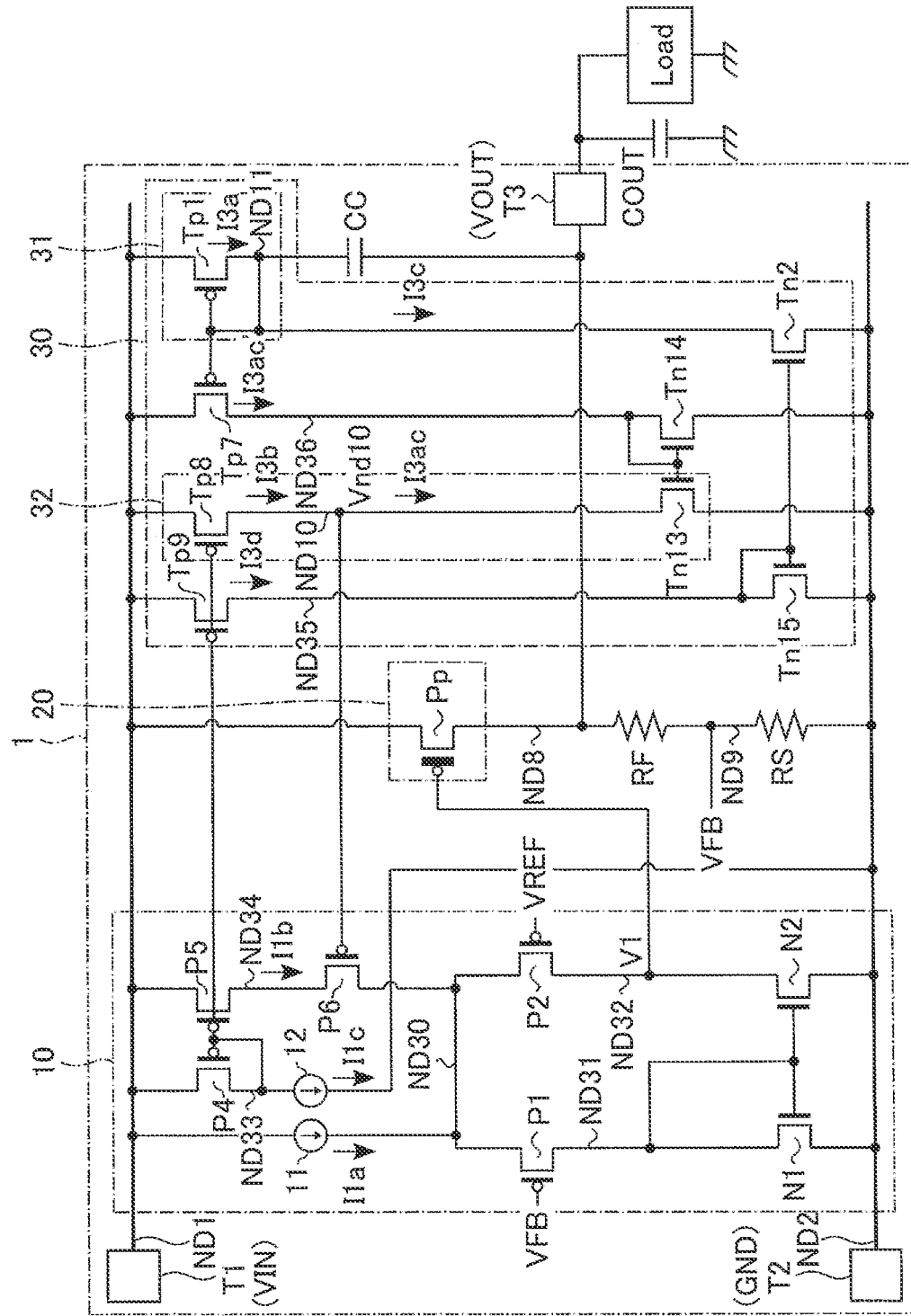
F I G. 22

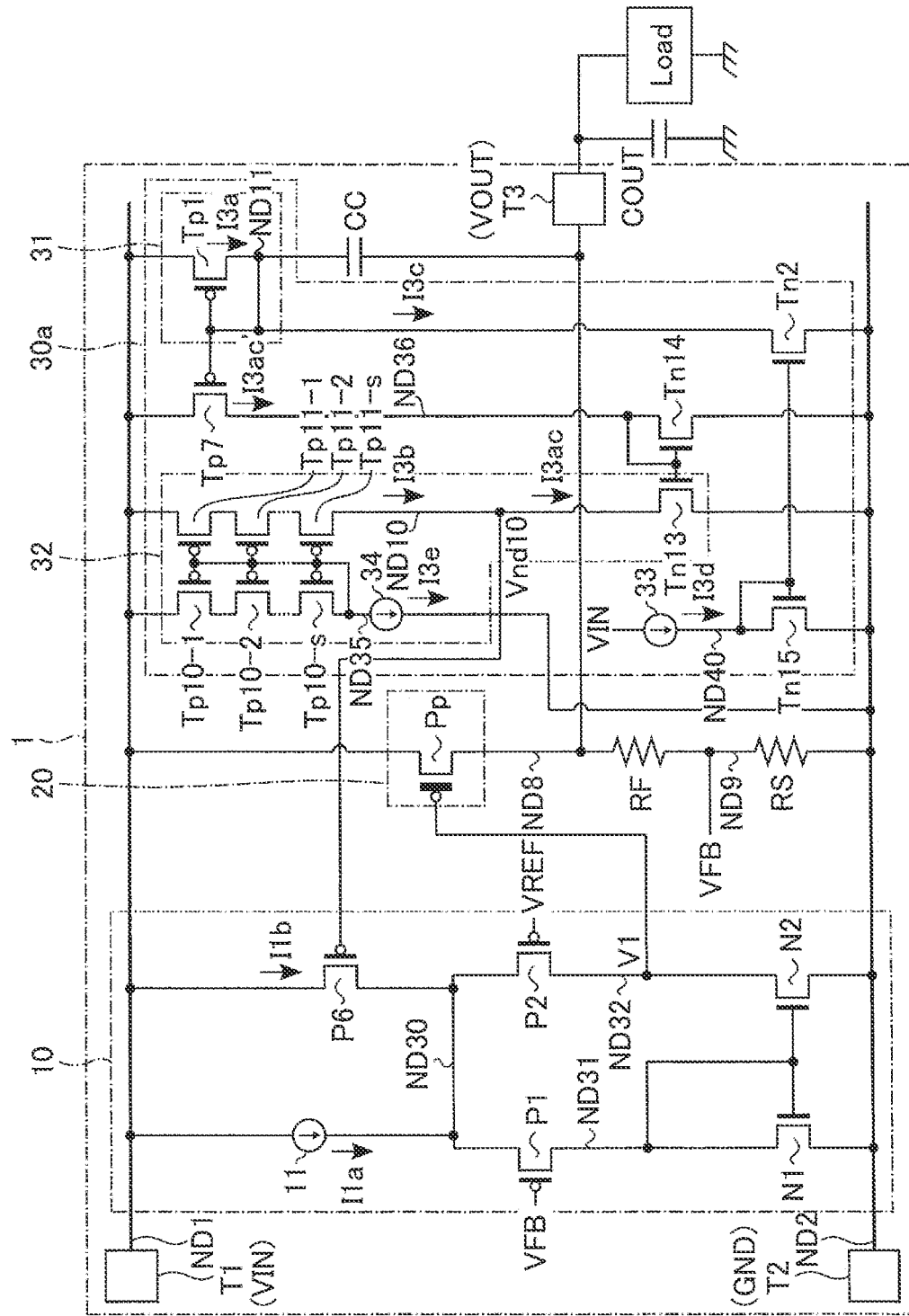
F I G. 24

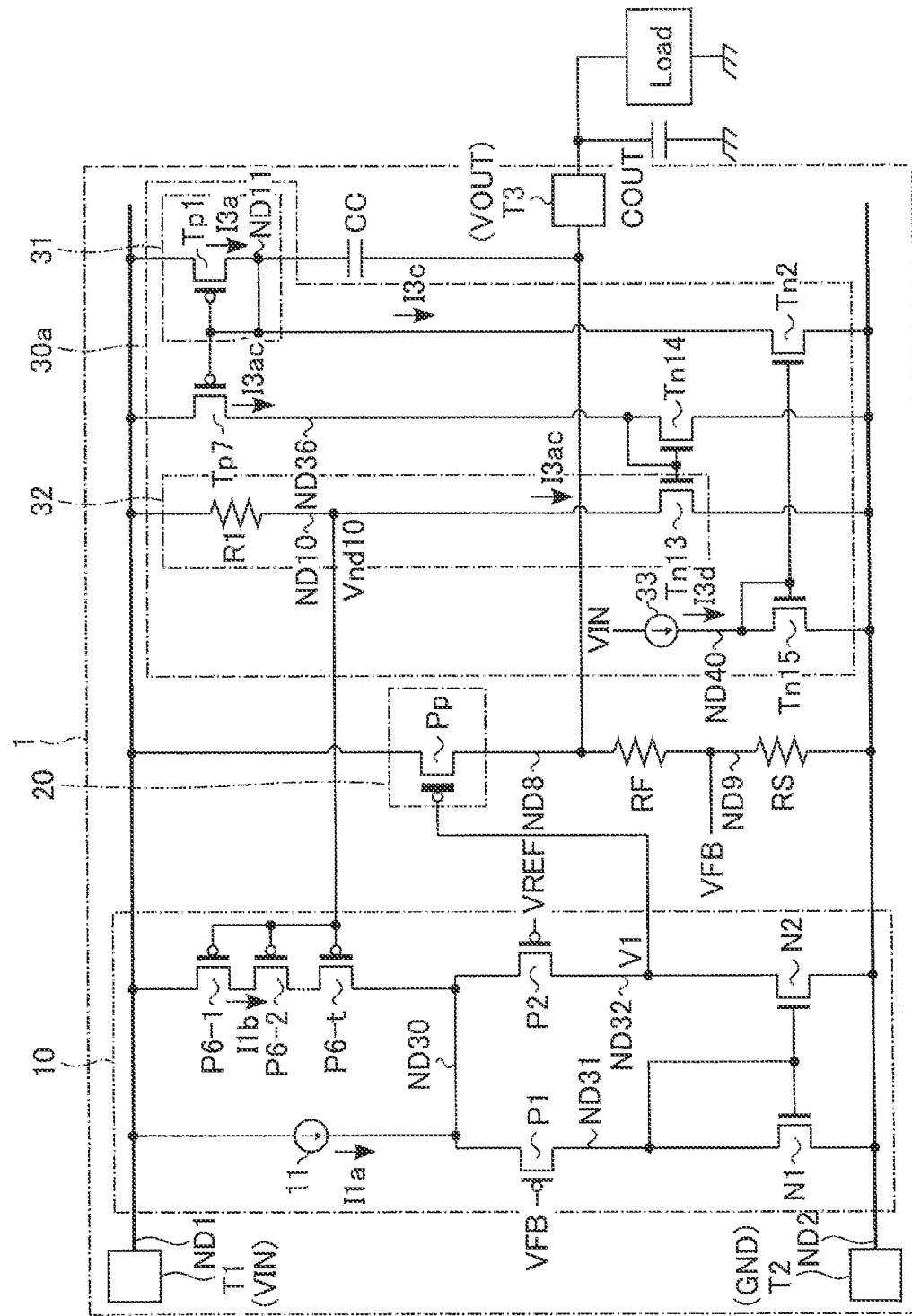
F I G. 25

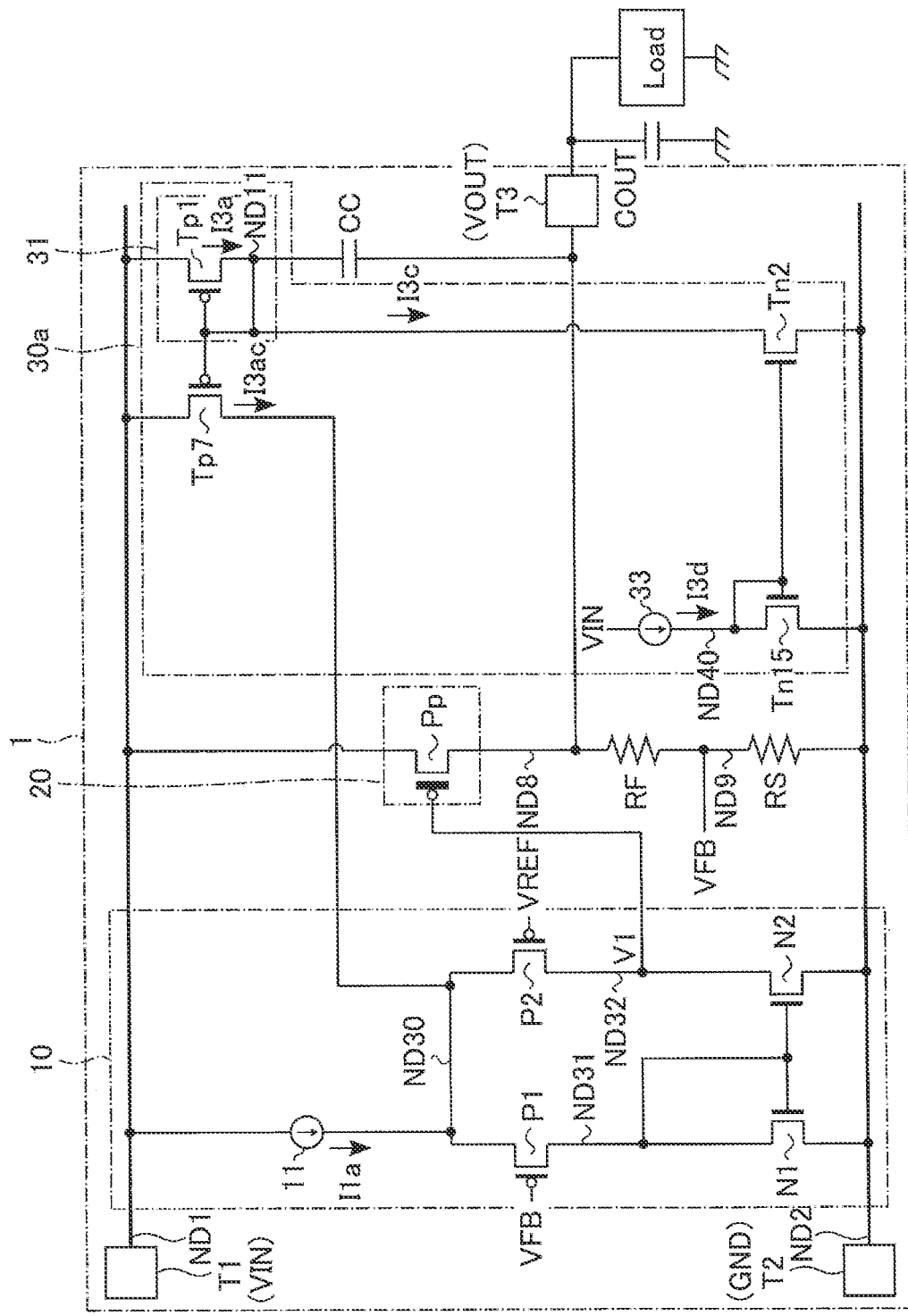
F I G. 26

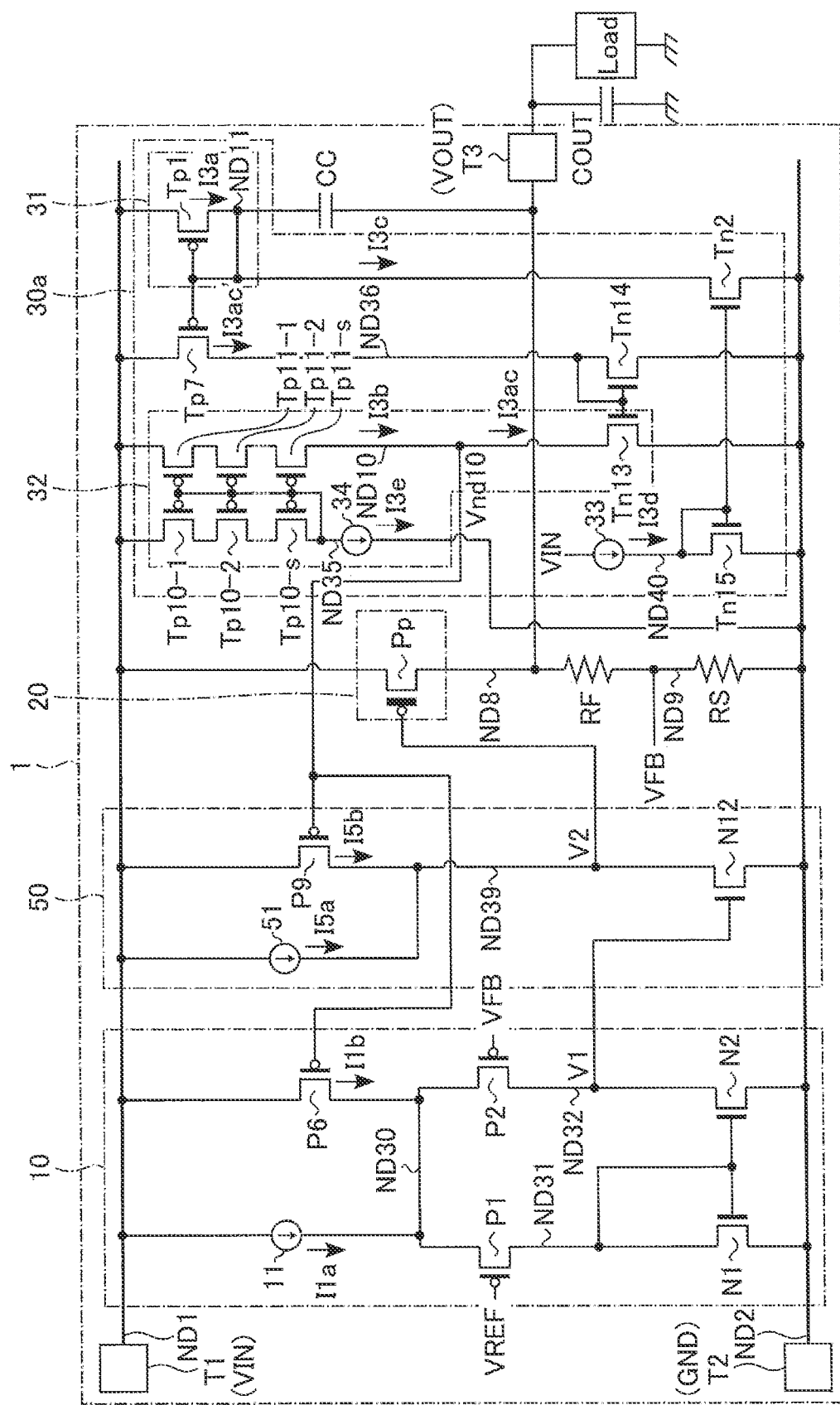
F I G. 27

CONSTANT VOLTAGE CIRCUIT

CROSS-REFERENCE TO RELATED APPLICATIONS

This application is based upon and claims the benefit of priority from Japanese Patent Application No. 2021-154698, filed Sep. 22, 2021, the entire contents of which are incorporated herein by reference.

FIELD

Embodiments described herein relate generally to a constant voltage circuit.

BACKGROUND

As one type of constant voltage circuit, a linear regulator has been known.

BRIEF DESCRIPTION OF THE DRAWINGS

FIG. 1 is a circuit diagram showing an example of a constant voltage circuit according to a first embodiment.

FIG. 5 is a circuit diagram showing an example of a constant voltage circuit according to a second embodiment.

FIG. 8 is a circuit diagram showing an example of a constant voltage circuit according to a third embodiment.

FIG. 9 is a circuit diagram showing an example of a constant voltage circuit according to a fourth embodiment.

FIG. 12 is a circuit diagram showing an example of a constant voltage circuit according to a fifth embodiment.

FIG. 13 is a circuit diagram showing an example of a constant voltage circuit according to a sixth embodiment.

FIG. 14 is a circuit diagram showing an example of a constant voltage circuit according to a seventh embodiment.

FIG. 15 is a circuit diagram showing an example of a constant voltage circuit according to an eighth embodiment.

FIG. 19 is a circuit diagram showing an example of a constant voltage circuit according to a ninth embodiment.

FIG. 20 is a circuit diagram showing an example of a constant voltage circuit according to a tenth embodiment.

FIG. 21 is a circuit diagram showing an example of a constant voltage circuit according to an eleventh embodiment.

FIG. 22 is a circuit diagram showing an example of a constant voltage circuit according to a twelfth embodiment.

FIG. 24 is a circuit diagram showing an example of a constant voltage circuit according to a fourteenth embodiment.

FIG. 25 is a circuit diagram showing an example of a constant voltage circuit according to a fifteenth embodiment.

FIG. 26 is a circuit diagram showing an example of a constant voltage circuit according to a sixteenth embodiment.

FIG. 27 is a circuit diagram showing an example of a constant voltage circuit according to a seventeenth embodiment.

DETAILED DESCRIPTION

Figure 2:
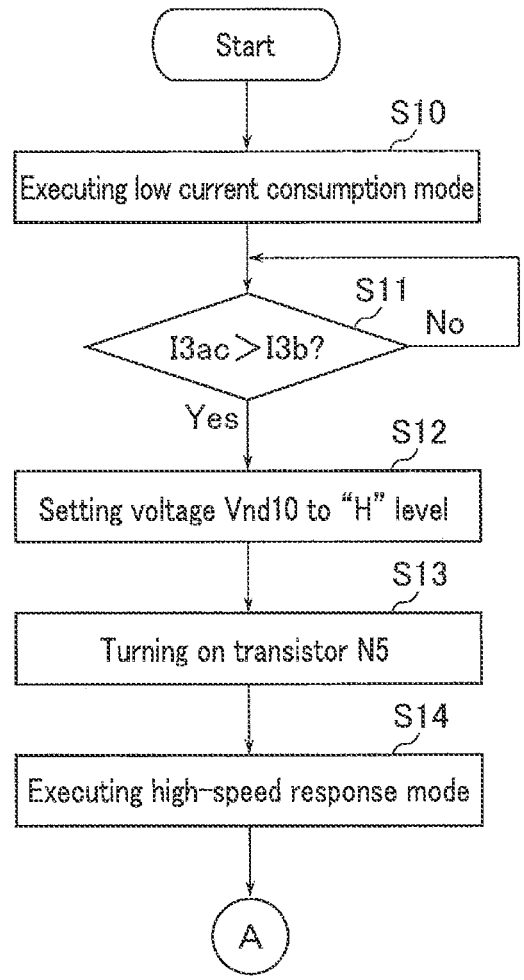
FIG. 2 is a flowchart showing a mode selection operation of the constant voltage circuit according to the first embodiment.

In general, according to one embodiment, a constant voltage circuit includes: a first gain stage configured to output a first voltage obtained by amplifying a difference between a reference voltage and a divided voltage obtained by dividing an output voltage; a first transistor having a first end, a second end, and a gate, the first end being coupled to an input voltage terminal, the second end being coupled to an output voltage terminal, the first transistor being configured to control the output voltage based on the first voltage applied to the gate; a second transistor configured to control a current that flows through the first gain stage; a first circuit configured to convert an amount of fluctuation in the output voltage into a first current, and a second circuit configured to control a gate voltage of the second transistor based on a second current corresponding to the first current. In a case where the gate voltage of the second transistor is smaller than or equal to a first threshold voltage of the second transistor, a first operation mode is selected, so that a third current flows through the first gain stage, and in a case where the gate voltage of the second transistor is greater than the first threshold voltage, a second operation mode is selected, so that a fourth current greater than the third current flows through the first gain stage.

Hereinafter, embodiments will be described with reference to the accompanying drawings. In the following description, components having substantially the same function and configuration will be assigned the same reference numeral, and repeat descriptions may be omitted. All descriptions of an embodiment are applicable to another embodiment unless expressly or implicitly excluded.

The function blocks do not have to be distinguished as in the example that follows. For example, some of the functions may be implemented by a function block other than the function blocks to be described as an example. In addition, the function blocks to be described as an example may be further divided into functional sub-blocks. Embodiments are not limited by which function block specifies them.

In the specification and the claims described herein, a first component being "coupled" to a second element includes the first component being coupled to the second component directly or through the intervention of a component that is constantly conductive or selectively conductive.

1. First Embodiment

A constant voltage circuit according to a first embodiment will be described. In the present embodiment, a linear regulator will be described as an example of a constant voltage circuit.

The constant voltage circuit according to the present embodiment includes, as operation modes, a low current consumption mode and a high-speed response mode. The low current consumption mode is selected to suppress current consumption when, for example, there is no load. The high-speed response mode is selected to cause the constant voltage circuit to operate at a high speed when, for example, a load is generated to cause the fluctuations in output voltage.

1.1 Circuit Configuration of Constant Voltage Circuit

A circuit configuration of a constant voltage circuit according to a present embodiment will be described with reference to FIG. 1. FIG. 1 is a circuit diagram showing an example of the constant voltage circuit. Hereinafter, when a source and a drain of a transistor are not distinguished from each other, one of them will be referred to as "one end of a transistor or a first end of a transistor" and the other of them will be referred to as "the other end of the transistor or a second end of the transistor".

A constant voltage circuit 1 includes an input voltage terminal T1, a reference voltage terminal T2, an output voltage terminal T3, a first gain stage 10, an output stage 20, a first voltage monitor circuit 30, resistance elements RF and RS, and a capacitive element CC.

The input voltage terminal T1 is coupled to a node ND1 (hereinafter, also referred to as a "power supply voltage interconnect") and an input voltage VIN is externally applied to the input voltage terminal T1.

The reference voltage terminal T2 is coupled to a node ND2 (hereinafter, also referred to as a "ground voltage interconnect"). For example, the reference voltage terminal T2 may be grounded or a ground voltage (VSS) may be applied to the reference voltage terminal T2.

The output voltage terminal T3 is coupled to a node ND8. The output voltage terminal T3 outputs an output voltage VOUT. For example, when using the constant voltage circuit 1, a capacitance element COUT is coupled between the output voltage terminal T3 and a Load coupled to an outside of the constant voltage circuit 1. The capacitance element COUT functions as an output capacitor. The capacitance element COUT suppresses, for example, fluctuations in a Load coupled to the output voltage terminal T3, variations in output voltage VOUT due to an influence of, e.g., parasitic inductance occurring between the constant voltage circuit 1 and the Load, oscillations, and the like. For example, one electrode of the capacitance element COUT is coupled to the output voltage terminal T3, and the other electrode is grounded (coupled to the ground voltage interconnect).

The resistance elements RF and RS each function as a voltage divider circuit of the output voltage VOUT. One end of the resistance element RF is coupled to the node ND8, and the other end is coupled to a node ND9. One end of the resistance element RS is coupled to the node ND9, and the other end is coupled to the node ND2. A voltage applied to the node ND9 will be referred to as a "feedback voltage VFB", a resistance value of the resistance element RF will be referred to as "rF", and a resistance value of the resistance element RS will be referred to as "rS". Then, the output voltage VOUT and the voltage VFB establish a relationship of VOUT=VFB×(1+rF/rS). That is, the voltage VFB is a divided voltage obtained by dividing the output voltage VOUT.

The capacitance element CC functions as a filter that cuts a DC component of the output voltage VOUT. One electrode of the capacitance element CC is coupled to a node ND11, and the other electrode is coupled to the node ND8.

The first gain stage 10 is a differential amplifier circuit. The first gain stage 10 compares a reference voltage VREF with the voltage VFB, and outputs a voltage (amplified) in accordance with their difference to the output stage 20. The first gain stage 10 includes p-channel Metal Oxide Semiconductor Field Effect Transistors (MOSFET) (hereinafter, also referred to as "PMOS transistors") P1 and P2, n-channel MOSFETs (hereinafter, also referred to as "NMOS transistors") N1 to N5, and current sources 11 and 12.

One end of the PMOS transistor P1 is coupled to the node ND1, and the other end and a gate are coupled to a node ND3.

One end of the PMOS transistor P2 is coupled to the node ND1, the other end is coupled to a node ND4, and a gate is coupled to the node ND3. That is, the PMOS transistors P1 and P2 form a current mirror.

One end of the NMOS transistor N1 is coupled to the node ND3, and the other end is coupled to a node ND5. A voltage VFB is applied to a gate of the NMOS transistor N1.

One end of the NMOS transistor N2 is coupled to the node ND4, and the other end is coupled to the node ND5. The reference voltage VREF is applied to a gate of the NMOS transistor N2. The reference voltage VREF is a constant reference voltage which does not depend on the temperature or the input voltage VIN.

One end of the current source 11 is coupled to the node ND5, and the other end is coupled to the node ND2. A current I1a flows from the current source 11 to the node ND2.

One end and a gate of the NMOS transistor N3 are coupled to a node ND6, and the other end is coupled to the node ND2.

The input voltage VIN is applied to one end of the current source 12. The other end of the current source 12 is coupled to the node ND6. A current I1c flows from the current source 12 through the NMOS transistor N3 to the node ND2.

One end of the NMOS transistor N4 is coupled to a node ND7, the other end is coupled to the node ND2, and a gate is coupled to the node ND6. That is, the NMOS transistors N3 and N4 form a current mirror.

One end of the NMOS transistor N5 is coupled to the node ND5, the other end is coupled to the node ND7, and a gate is coupled to a node ND10. The NMOS transistor N5 operates based on a voltage Vnd10 of the node ND10.

For example, the voltage Vnd10 is set to an "H" level in the case of the high-speed response mode and is set to an "L" level in the case of the low current consumption mode. For example, the NMOS transistor N5 is turned on (turned to an ON state (a coupled state)) in the case of the voltage Vnd10 being at the "H" level, and is turned off (turned to an OFF state (a decoupled state)) in the case of the voltage Vnd10 being at the "L" level. With the NMOS transistor N5 being in the ON state, a current I1b corresponding to the current I1c flows through the NMOS transistors N4 and N5. For example, the current I1b is a current greater than the current I1a. For example, the current I1b may be 100 times greater than the current I1a. In the case of the low current consumption mode, the operation current I1a flows through the first gain stage 10. In the case of the high-speed response mode, an operation current (I1a+I1b) flows through the first gain stage 10. The operation current (I1a+I1b) is greater than the operation current I1a. Therefore, the high-speed response mode enables the output stage 20 in the subsequent stage to be driven at a higher speed than the low current consumption mode.

The output stage 20 controls the output voltage VOUT of the constant voltage circuit 1. The output stage 20 includes a PMOS transistor Pp.

One end of the PMOS transistor Pp is coupled to the node ND1, and the other end is coupled to the node ND8. The node ND4 is coupled to a gate of the PMOS transistor Pp. In other words, the output voltage V1 of the first gain stage 10 is applied to the gate of the PMOS transistor Pp. The PMOS transistor Pp functions as an output driver of the constant voltage circuit 1. To make the output voltage VOUT constant, a gate voltage of the PMOS transistor Pp fluctuates in accordance with fluctuations in output voltage VOUT, and an ON resistance of the PMOS transistor Pp is adjusted.

For example, in the case of there being no voltage difference between the reference voltage VREF and the voltage VFB, that is, in the case of VFB=VREF, the output voltage VOUT is expressed as VOUT=VREF×(1+rF/rS). The formula that expresses the output voltage VOUT does not include a term of the input voltage VIN or a load current flowing through the Load. Therefore, the output voltage VOUT can maintain a constant voltage even when the input voltage VIN and the Load fluctuate.

The first voltage monitor circuit 30 monitors a drop in output voltage VOUT, and controls the voltage Vnd10 of the node ND10 in accordance with the monitored drop. The first voltage monitor circuit 30 includes a first voltage-current conversion circuit 31, a first current comparator 32, and an NMOS transistor Tn2.

The first voltage-current conversion circuit 31 converts, into a current, the amount of drop in an AC component of the output voltage VOUT from which a DC component has been cut by the capacitance element CC. The first voltage-current conversion circuit 31 includes a PMOS transistor Tp1.

One end of the PMOS transistor Tp1 is coupled to the node ND1, and the other end and a gate are coupled to the node ND11. For example, in the case where there is no fluctuation in the AC component of the output voltage VOUT or the drop in the AC component of the output voltage VOUT is slow, the PMOS transistor Tp1 is turned to the OFF state or the ON state based on a voltage difference between the gate and the source. Therefore, a current I3a does not flow or the micro current I3a flows through the PMOS transistor Tp1. On the other hand, in the case where the drop in the AC component of the output voltage VOUT is sharp, a voltage of the node ND11 falls, thereby increasing the voltage difference between the gate and the source, so that the PMOS transistor Tp1 is turned to the ON state. Therefore, the current I3a flows through the PMOS transistor Tp1. Herein, as the capacitance element CC becomes greater in capacitance value, the current I3a becomes greater.

The first current comparator 32 compares a current corresponding to the current I3a converted by the first voltage-current conversion circuit 31 with a reference current to be described later, and controls the voltage Vnd10 in accordance with a voltage difference between these currents. The first current comparator 32 includes a PMOS transistor Tp2 and an NMOS transistor Tn1.

One end of the PMOS transistor Tp2 is coupled to the node ND1, the other end is coupled to the node ND10, and a gate is coupled to the node ND11. That is, the PMOS transistors Tp1 and Tp2 form a current mirror.

One end of the NMOS transistor Tn1 is coupled to the node ND10, the other end is coupled to the node ND2, and a gate is coupled to the node ND6. That is, the NMOS transistors N3 and Tn1 form a current mirror.

For example, in the case where there is no fluctuation in the AC component of the output voltage VOUT or the drop in the AC component of the output voltage VOUT is slow, as described in the above, the current I3a does not flow or the micro current I3a flows through the PMOS transistor Tp1. In the case where the current I3a does not flow, the PMOS transistor Tp2 is turned to the OFF state, so that a current I3ac corresponding to the current I3a does not flow through the PMOS transistor Tp2. On the other hand, a current I3b corresponding to the current I1c flows through the NMOS transistor Tn1. In the case where the current I3a flows, the PMOS transistor Tp2 is turned to the ON state, so that the current I3ac momentarily flows through the PMOS transistor Tp2. On the other hand, the current I3b flows through the NMOS transistor Tn1. The current I3ac and the current I3b ultimately take the same current value.

On the other hand, in the case where the AC component of the output voltage VOUT drops sharply, as described in the above, the current I3a flows through the PMOS transistor Tp1. In this case, the PMOS transistor Tp2 is turned to the ON state, so that the current I3ac momentarily flows through the PMOS transistor Tp2. On the other hand, the current I3b flows through the NMOS transistor Tn1.

The first current comparator 32 compares the current I3ac with the current I3b. The current I3b is used as a reference current to be compared with the current I3ac.

In the case where the current I3ac does not flow, the voltage Vnd10 is set to a voltage approximate to a voltage VSS (is set to the "L" level). In other words, the first current comparator 32 sets the voltage Vnd10 to the "L" level. Herein, the voltage approximate to the voltage VSS is, for example, a voltage smaller than a threshold voltage of the NMOS transistor N5.

In the case where the current I3ac flows and it is greater than the current I3b, the voltage Vnd10 rises. Thus, in this case, the voltage Vnd10 is set to a voltage approximate to the voltage VIN (is set to the "H" level). In other words, the first current comparator 32 sets the voltage Vnd10 to the "H" level. This is the case in which, for example, the AC component of the output voltage VOUT drops sharply. Herein, the voltage approximate to the voltage VIN is, for example, a voltage greater than a threshold voltage of the NMOS transistor N5. In the case where the current I3ac flows and it is smaller than the current I3b, the voltage Vnd10 drops. Thus, in this case, the voltage Vnd10 is set to a voltage approximate to the voltage VSS (is set to the "L" level). In other words, the first current comparator 32 sets the voltage Vnd10 to the "L" level. This is the case in which, for example, there is no fluctuation in the AC component of the output voltage VOUT or the drop in the AC component of the output voltage VOUT is slow. Furthermore, in the case where the current I3ac flows and it is equal to the current I3b, the voltage Vnd10 is maintained as a voltage approximate to the voltage VSS (is maintained at the "L" level). In other words, the first current comparator 32 maintains the voltage Vnd10 at the "L" level.

The NMOS transistor Tn2 is provided in order to adjust the current I3a. One end of the NMOS transistor Tn2 is coupled to the node ND11, the other end is coupled to the node ND2, and a gate is coupled to the node ND6. That is, the NMOS transistors N3 and Tn2 form a current mirror. The current I3c corresponding to the current I1c flows through the NMOS transistor Tn2. This results in the current I3a being biased by the current I3c. Meanwhile, a current value of the current I3c may be switched by a register or an eFuse.

1.2 Mode Selection Operation

Figure 3:
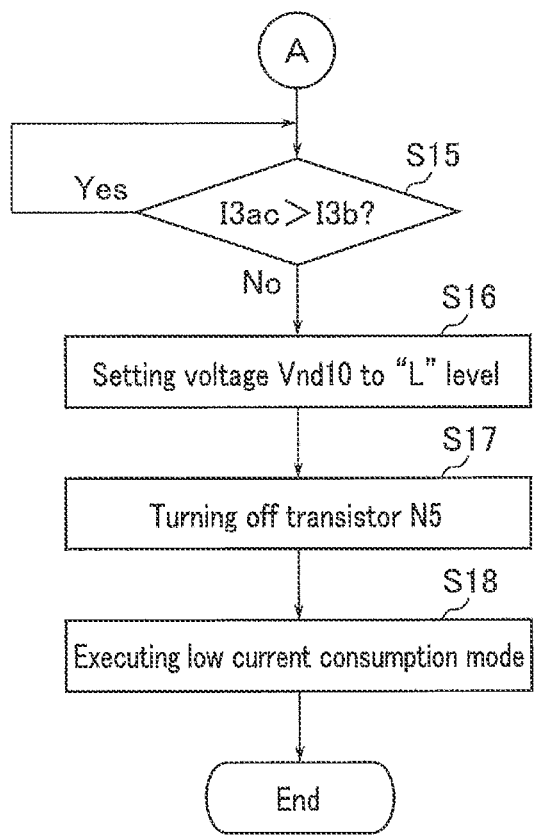
FIG. 3 is a flowchart showing the mode selection operation of the constant voltage circuit according to the first embodiment.

A mode selection operation of the constant voltage circuit 1 according to the present embodiment will be described with reference to FIG. 2 and FIG. 3. FIG. 2 and FIG. 3 are each a flowchart showing a mode selection operation of the constant voltage circuit 1. The following will describe, as an example, the case in which the constant voltage circuit 1 transitions from the low current consumption mode to the high-speed response mode, and thereafter transitions from the high-speed response mode to the low current consumption mode.

The constant voltage circuit 1 executes the low current consumption mode (S10). At the time of execution of S10, the first voltage monitor circuit 30 sets the voltage Vnd10 to the "L" level. The NMOS transistor N5 is turned to the OFF state based on the voltage Vnd10 at the "L" level.

Next, the first current comparator 32 compares the current I3ac with the current I3b. In the case of the current I3ac being smaller than or equal to the current I3b (S11_No), the first current comparator 32 maintains the voltage Vnd10 at the "L" level. That is, the constant voltage circuit 1 maintains the low current consumption mode. On the other hand, in the case of the current I3ac being greater than the current I3b (S11_Yes), the first current comparator 32 sets the voltage Vnd10 to the "H" level (S12).

The NMOS transistor N5 is turned to the ON state based on the voltage Vnd10 at the "H" level (S13). As a result, the constant voltage circuit 1 executes the high-speed response mode (S14).

Next, the first current comparator 32 compares the current I3ac with the current I3b. In the case of the current I3ac being greater than the current I3b (S15_Yes), the first current comparator 32 maintains the voltage Vnd10 at the "H" level. That is, the constant voltage circuit 1 maintains the high-speed response mode. On the other hand, in the case of the current I3ac being smaller than or equal to the current I3b (S15_No), the first current comparator 32 sets the voltage Vnd10 to the "L" level (S16).

The NMOS transistor N5 is turned to the OFF state based on the voltage Vnd10 at the "L" level (S17). As a result, the constant voltage circuit 1 executes the low current consumption mode (S18).

1.3 Advantageous Effect

Figure 4:
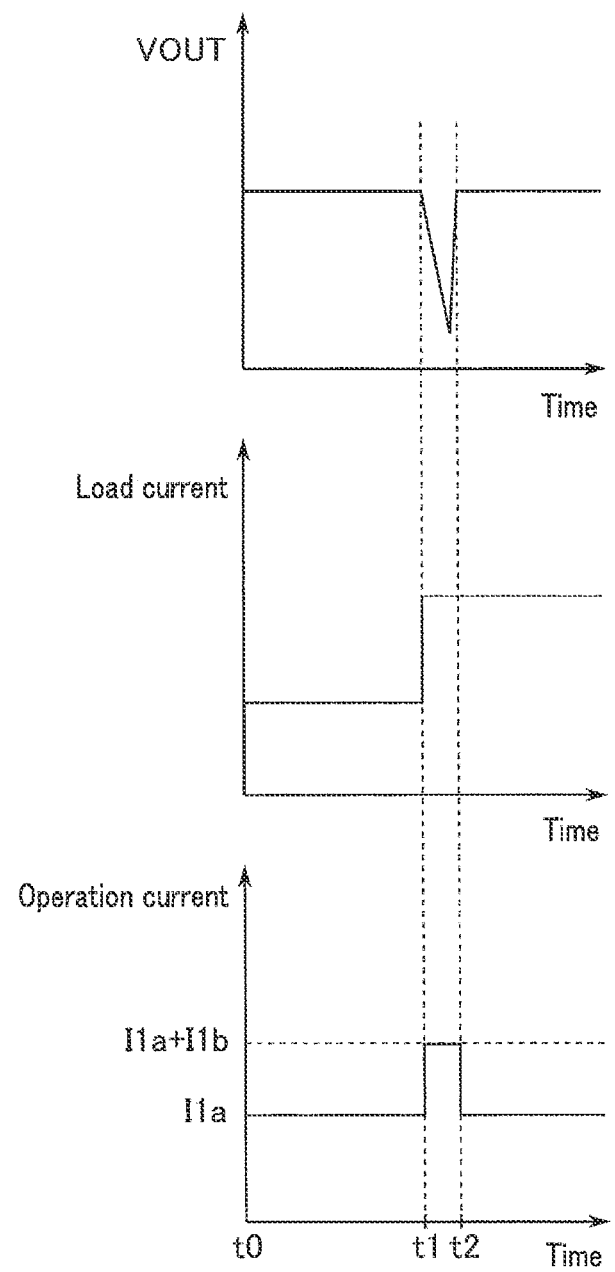
FIG. 4 is a diagram illustrating the advantageous effect of the constant voltage circuit according to the first embodiment.

The configuration according to the present embodiment can realize a high-speed response and a low current consumption of the constant voltage circuit. Hereinafter, this advantageous effect will be described with reference to FIG. 4. FIG. 4 is a diagram illustrating the advantageous effect of the constant voltage circuit 1 according to the present embodiment.

As shown in FIG. 4, in the constant voltage circuit 1 according to the present embodiment, a period from time t0 to time t1 shows that the output voltage VOUT exhibits a voltage value in a steady state, there is no load, and the operation current of the first gain stage 10 is the current I1a. Assume that a load is generated at time t1. In this case, at time t1, the load current increases while the output voltage VOUT drops sharply from the voltage value in the steady state. However, at time t2, the output voltage VOUT is restored to the voltage value in the steady state. The reason for this is as follows. At time t1, the first voltage-current conversion circuit 31 converts the amount of the sharp drop in the AC component of the output voltage VOUT into the current I3a, the first current comparator 32 controls the voltage Vnd10 of the node ND10 to the "H" level based on the current I3ac corresponding to the current I3a, and the NMOS transistor N5 is turned to the ON state. This increases the operation current to I1a+I1b. At time t2, the operation current is restored to I1a. The reason for this is as follows. At time t2, the first current comparator 32 controls the voltage Vnd10 of the node ND10 to the "L" level, and the NMOS transistor N5 is turned to the OFF state. This decreases the operation current to I1a.

As described in the above, in the case where the AC component of the output voltage VOUT drops sharply, the constant voltage circuit 1 according to the present embodiment can increase the operation current of the first gain stage 10 based on the amount of such a drop. This can reduce a time until the output voltage VOUT is restored to the steady state. That is, the constant voltage circuit 1 according to the present embodiment can realize the high-speed response.

Furthermore, in the case where there is no fluctuation in the AC component of the output voltage VOUT or the drop in the AC component of the output voltage VOUT is slow, the voltage Vnd10 of the node ND10 is controlled to the "L" level, and the NMOS transistor N5 is turned to the OFF state, so that the constant voltage circuit 1 according to the present embodiment can realize low current consumption.

In addition, the constant voltage circuit 1 according to the present embodiment includes the NMOS transistor Tn2. By causing the current I3c to flow through the NMOS transistor Tn2, the current I3a flowing through the PMOS transistor Tp1 is biased. This can reduce a time until a voltage difference between the gate and the source of the PMOS transistor Tp1 exceeds a threshold voltage, so that the current I3a starts flowing through the PMOS transistor Tp1. That is, the response speed of the PMOS transistor Tp1 can be improved. Accordingly, a time until the current I3ac starts flowing through the PMOS transistor Tp2 can be reduced, too.

Furthermore, in the constant voltage circuit 1 according to the present embodiment, each of the NMOS transistors Tn1 and Tn2, and the NMOS transistor N3 form the current mirror, while the PMOS transistors Tp1 and Tp2 form the current mirror. The current mirror circuit is generally configured to have pair arrangement in consideration of a mismatch in layout design. This can suppress a variation in current value of the current I3b and the current I3c respectively generated by the NMOS transistor Tn1 and the NMOS transistor Tn2. Similarly, this can also suppress a variation in current value of the current I3a and the current I3ac respectively generated by the PMOS transistor Tp1 and the PMOS transistor Tp2. As a result, mismatch and variation in the first current comparator 32 can be suppressed.

2. Second Embodiment

The constant voltage circuit 1 according to a second embodiment will be described. The constant voltage circuit 1 according to the present embodiment differs from the first embodiment in terms of including a current monitor circuit 40 and an OR circuit OR1. Hereinafter, the following description will in principle concentrate on the features different from the first embodiment.

2.1 Circuit Configuration of Constant Voltage Circuit 1

A circuit configuration of the constant voltage circuit 1 according to the present embodiment will be described with reference to FIG. 5. FIG. 5 is a circuit diagram showing an example of the constant voltage circuit 1.

The constant voltage circuit 1 further includes the current monitor circuit 40 and the OR circuit OR1.

The current monitor circuit 40 monitors, in addition to an output current flowing through the output voltage terminal T3, a current flowing through each of the resistance elements RF and RS, that is, a current flowing through the PMOS transistor Pp, and outputs a voltage Vr in accordance with a current value of the monitored current. The current monitor circuit 40 includes a PMOS transistor PM and a comparator CM1.

One end of the PMOS transistor PM is coupled to the node ND1, and the other end is coupled to a node ND12. The node ND4 is coupled to a gate of the PMOS transistor PM. In other words, the output voltage V1 of the first gain stage 10 is applied to the gate of the PMOS transistor PM. For example, in the case where the voltage V1 fluctuates due to the fluctuation (rise) in output current (load current) of the constant voltage circuit 1, a current flowing from the node ND1 through the PMOS transistor PM into the node ND12 (a current corresponding to a current flowing through the PMOS transistor Pp, hereinafter referred to as "current Ind12") fluctuates (rises).

A threshold current Ith is supplied to an inversion input terminal of the comparator CM1. The threshold current Ith is a current used for judgment of the current Ind12 flowing through the node ND12. A non-inversion input terminal of the comparator CM1 is coupled to the node ND12. The current Ind12 flowing through the node ND12 is supplied to the non-inversion input terminal of the comparator CM1. The voltage Vr is output from an output terminal of the comparator CM1. For example, during a period in which the current Ind12 is greater than the threshold current Ith, the comparator CM1 outputs the voltage Vr at the "H" level. On the other hand, during a period in which the current Ind12 is smaller than or equal to the threshold current Ith, the comparator CM1 outputs the voltage Vr at the "L" level.

The OR circuit OR1 includes two input terminals. The voltage Vnd10 of the node ND10 is applied to one of the input terminals of the OR circuit OR1, and the voltage Vr is input to the other input terminal. The OR circuit OR1 performs an OR operation based on the voltage Vnd10 and the voltage Vr. The OR circuit OR1 transmits an operation result as a mode signal MS to the gate of the NMOS transistor N5. Specifically, in the case where at least one of the voltage Vnd10 and the voltage Vr is at the "H" level, the OR circuit OR1 transmits the mode signal MS at the "H" level. Furthermore, in the case where both of the voltage Vnd10 and the voltage Vr are at the "L" level, the OR circuit OR1 transmits the mode signal MS at the "L" level.

The NMOS transistor N5 operates based on the mode signal MS received from the OR circuit OR1.

The rest of the configuration of the constant voltage circuit 1 is similar to that of FIG. 1 according to the first embodiment.

For example, a value of the current I1*b* to be added may be varied at a time when the output voltage VOUT is dropped or at a time when the load current is raised.

2.2 Mode Selection Operation

Figure 6:
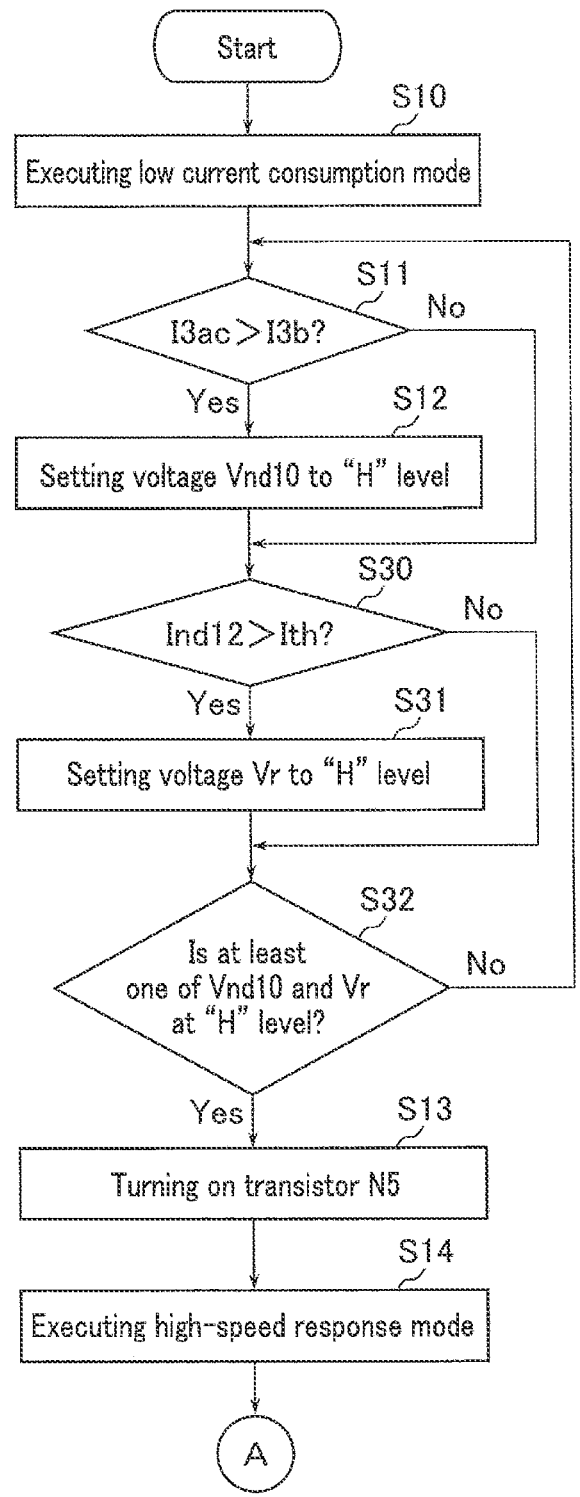
FIG. 6 is a flowchart showing a mode selection operation of the constant voltage circuit according to the second embodiment.
Figure 7:
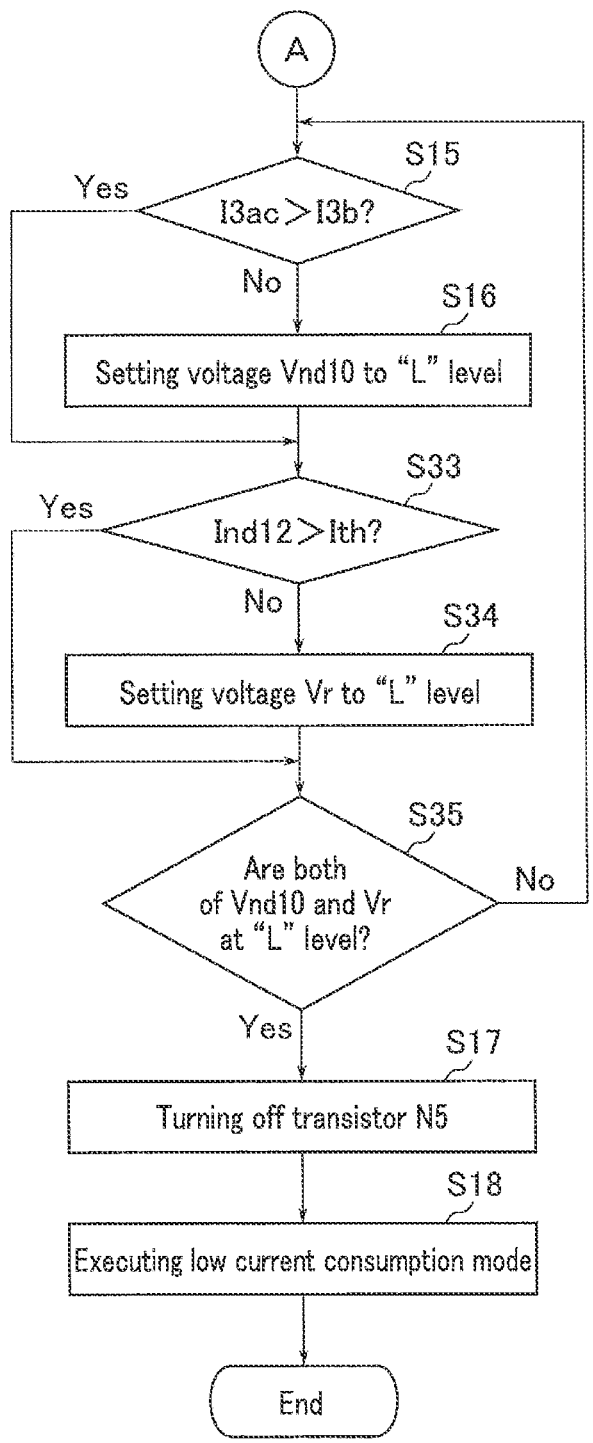
FIG. 7 is a flowchart showing the mode selection operation of the constant voltage circuit according to the second embodiment.

The mode selection operation of the constant voltage circuit 1 according to the present embodiment will be described with reference to FIG. 6 and FIG. 7. FIG. 6 and FIG. 7 are each a flowchart showing a mode selection operation of the constant voltage circuit 1. The operation from S30 to S35 is added to the operation from S10 to S18 in FIG. 2 and FIG. 3 according to the first embodiment. The operation from S10 to S18 is similar to those shown in FIG. 2 and FIG. 3 according to the first embodiment. Hereinafter, the following description will in principle concentrate on the operation from S30 to S35.

After the execution of S10 to S12, the voltage Vr is at the "L" level.

In the case of the current Ind12 being smaller than or equal to the threshold current Ith (S30_No), the current monitor circuit 40 maintains the voltage Vr at the "L" level. On the other hand, in the case where the current Ind12 is greater than the threshold current Ith (S30_Yes), the current monitor circuit 40 sets the voltage Vr at the "H" level (S31). In other words, the comparator CM1 outputs the voltage Vr at the "H" level during a period in which in the comparator CM1, the current Ind12 of the non-inversion input terminal is greater than the threshold current Ith of the inversion input terminal.

The NMOS transistor N5 maintains the OFF state in the case where both of the voltage Vnd10 and the voltage Vr are at the "L" level (S32_No). On the other hand, the NMOS transistor N5 is turned to the ON state (S13) in the case where at least one of the voltage Vnd10 and the voltage Vr is at the "H" level (S32_Yes).

After the execution of S13 to S16, the voltage Vr is at the "H" level.

In the case where the current Ind12 is greater than the threshold current Ith (S33_Yes), the current monitor circuit 40 maintains the voltage Vr at the "H" level. On the other hand, in the case where the current Ind12 is smaller than or equal to the threshold current Ith (S33_No), the current monitor circuit 40 sets the voltage Vr to the "L" level (S34). In other words, the comparator CM1 outputs the voltage Vr at the "L" level during a period in which in the comparator CM1, the current Ind12 of the non-inversion input terminal is smaller than or equal to the threshold current Ith of the inversion input terminal.

In the case where at least one of the voltage Vnd10 and the voltage Vr is at the "H" level (S35_No), the NMOS transistor N5 maintains the ON state. On the other hand, in the case where both of the voltage Vnd10 and the voltage Vr are at the "L" level (S35_Yes), the NMOS transistor N5 is turned to the OFF state (S17).

2.3 Advantageous Effect

The configuration according to the present embodiment produces an advantageous effect similar to that of the first embodiment.

The configuration according to the present embodiment includes the current monitor circuit 40, so that, regardless of whether there is a fluctuation in the output voltage VOUT or not, the high-speed response mode can be maintained when the load current is raised.

3. Third Embodiment

The constant voltage circuit 1 according to a third embodiment will be described. The constant voltage circuit 1 according to the present embodiment differs from the first embodiment in terms of including a second gain stage 50. Hereinafter, the following description will in principle concentrate on the features different from the first embodiment.

3.1 Circuit Configuration of Constant Voltage Circuit 1

A circuit configuration of the constant voltage circuit 1 according to the present embodiment will be described with reference to FIG. 8. FIG. 8 is a circuit diagram showing an example of the constant voltage circuit 1.

The constant voltage circuit 1 further includes the second gain stage 50.

The second gain stage 50 amplifies the output voltage V1 of the first gain stage 10, thereby outputting the amplified voltage to the output stage 20. The second gain stage 50 includes the PMOS transistor P3 and the NMOS transistors N6 to N8.

One end of the PMOS transistor P3 is coupled to the node ND1, and the other end is coupled to a node ND13. The node ND4 is coupled to a gate of the PMOS transistor P3. In other words, the output voltage V1 of the first gain stage 10 is applied to the gate of the PMOS transistor P3.

One end of the NMOS transistor N6 is coupled to the node ND13, the other end is coupled to the node ND2, and a gate is coupled to the node ND6. That is, the NMOS transistors N3 and N6 form a current mirror. A current I5a corresponding to the current I1c flows through the NMOS transistor N6.

One end of the NMOS transistor N7 is coupled to a node ND15, the other end is coupled to the node ND2, and a gate is coupled to the node ND6. In other words, the NMOS transistors N3 and N7 form a current mirror.

One end of the NMOS transistor N8 is coupled to the node ND13, the other end is coupled to the node ND15, and a gate is coupled to the node ND10. The NMOS transistor N8 operates based on the voltage Vnd10 of the node ND10.

For example, the NMOS transistor N8 is turned to the ON state in the case of the voltage Vnd10 being at the "H" level, and is turned to the OFF state in the case of the voltage Vnd10 being at the "L" level. With the NMOS transistor N8 being in the ON state, a current I5b corresponding to the current I1c flows through the NMOS transistors N7 and N8. For example, the current I5b is a current greater than the current I5a. In the case of the low current consumption mode, the operation current I5a flows through the second gain stage 50. In the case of the high speed response-mode, an operation current (I5a+I5b) flows through the second gain stage 50. The operation current (I5a+I5b) is greater than the operation current I5a. Therefore, the high-speed response mode enables the output stage 20 in the subsequent stage to be driven at a higher speed than the low current consumption mode.

The node ND13 is coupled to the gate of the PMOS transistor Pp of the output stage 20. In other words, the output voltage V2 of the second gain stage 50 is applied to the gate of the PMOS transistor Pp.

The reference voltage VREF is applied to the gate of the NMOS transistor N1.

The voltage VFB is applied to the gate of the NMOS transistor N2.

The rest of the configuration of the constant voltage circuit 1 is similar to that of FIG. 1 according to the first embodiment.

For example, in the case of the voltage Vnd10 being at the "H" level, only one of the NMOS transistors N5 and N8 may be turned to the ON state.

Furthermore, the NMOS transistor N6 may be eliminated from the second gain stage 50, so that another current source, another NMOS transistor, and the NMOS transistor N7 may form a current mirror. In this case, each of the NMOS transistors Tn1 and Tn2 of the first voltage monitor circuit 30, and the NMOS transistor of the first gain stage 10 may form a current mirror, or each of the NMOS transistors Tn1 and Tn2 of the first voltage monitor circuit 30, and the NMOS transistor of the second gain stage 50 may form a current mirror.

3.2 Mode Selection Operation

The mode selection operation of the constant voltage circuit 1 according to the present embodiment will be described. The flowchart illustrating the mode selection operation of the constant voltage circuit 1 according to the present embodiment corresponds to those in FIG. 2 and FIG. 3 according to the first embodiment modified by replacing "N5" in S13 and S17 with "N5 and N8".

3.3 Advantageous Effect

The configuration according to the present embodiment produces an advantageous effect similar to that described in the first embodiment. As a matter of course, the present embodiment is applicable to the second embodiment.

4. Fourth Embodiment

The constant voltage circuit 1 according to a fourth embodiment will be described. The constant voltage circuit 1 according to the present embodiment differs from the first embodiment in terms of the configuration of the first gain stage 10 and the first voltage monitor circuit 30. In order to distinguish from the first embodiment, the first voltage monitor circuit 30 will be referred to as a first voltage monitor circuit 30a. Hereinafter, the following description will in principle concentrate on the features different from the first embodiment.

4.1 Circuit Configuration of Constant Voltage Circuit 1

A circuit configuration of the constant voltage circuit 1 according to the present embodiment will be described with reference to FIG. 9. FIG. 9 is a circuit diagram showing an example of the constant voltage circuit 1.

The NMOS transistors N3 and N4 and the current source 12 shown in FIG. 1 according to the first embodiment are eliminated from the first gain stage 10.

The first voltage monitor circuit 30a further includes an NMOS transistor Tn3 and a current source 33.

One end and a gate of the NMOS transistor Tn3 are coupled to a node ND16, and the other end is coupled to the node ND2. The gate of the NMOS transistor Tn2 is coupled to the node ND16. That is, the NMOS transistors Tn3 and Tn2 form a current mirror.

The input voltage VIN is applied to one end of the current source 33. The other end of the current source 33 is coupled to the node ND16. A current I3d flows from the current source 33 to the node ND2 through the NMOS transistor Tn3. A current I3c corresponding to the current I3d flows through the NMOS transistor Tn2.

The NMOS transistor Tn1 in FIG. 1 according to the first embodiment is eliminated from the first current comparator 32. The first current comparator 32 further includes NMOS transistors Tn4-1 to Tn4-m (where m is an integer greater than or equal to 1) and Tn5-1 to Tn5-m, and a current source 34.

The NMOS transistors Tn4-1 to Tn4-m are coupled in series. One end of the NMOS transistors Tn4-1 to Tn4-m coupled in series is coupled to a node ND17. The other end of the NMOS transistors Tn4-1 to Tn4-m coupled in series is coupled to the node ND2. Each of gates of the NMOS transistors Tn4-1 to Tn4-m is coupled to the node ND17.

The input voltage VIN is applied to one end of the current source 34. The other end of the current source 34 is coupled to the node ND17. A current I3e flows from the current source 34 to the NMOS transistors Tn4-1 to Tn4-m.

The NMOS transistors Tn5-1 to Tn5-m are coupled in series. One end of the NMOS transistors Tn5-1 to Tn5-m coupled in series is coupled to the node ND10. The other end of the NMOS transistors Tn5-1 to Tn5-m coupled in series is coupled to the node ND2. Each of gates of the NMOS transistors Tn5-1 to Tn5-m is coupled to the node ND17. That is, the NMOS transistors Tn4-1 to Tn4-m and the NMOS transistors Tn5-1 to Tn5-m form the current mirror. The current I3b corresponding to the current I3e flows through the NMOS transistors Tn5-1 to Tn5-m. Since the NMOS transistors Tn5-1 to Tn5-m are coupled in series, the current I3b is high in constant current characteristic.

In the first current comparator 32, the PMOS transistor Tp2 is made shorter in gate length L than the PMOS transistor Tp1. In this case, the channel-length modulation effects of the PMOS transistor Tp2 cause the current I3ac to rise more than in the case in which the gate length L is long. When the current I3ac rises, the voltage Vnd10 of the node ND10 rises. On the other hand, when the voltage Vnd10 rises, the current I3b rises. Therefore, the voltage Vnd10 rises gradually. In other words, the first current comparator 32 slowly changes the voltage Vnd10 of the node ND10. Accordingly, the voltage Vnd10 takes a voltage value ranging between the voltage VSS and the voltage VIN. As the amount of drop in output voltage VOUT becomes larger, the voltage Vnd10 becomes greater. As the amount of drop in output voltage VOUT becomes smaller, the voltage Vnd10 becomes smaller. In the case where the current I3ac does not flow, the voltage Vnd10 is set to a voltage approximate to the voltage VSS.

The NMOS transistor N5 is turned to the ON state when the voltage Vnd10 exceeds the threshold voltage Vth5 of the NMOS transistor N5, so that the current I1b corresponding to the voltage Vnd10 flows through the first gain stage 10.

The rest of the configuration of the constant voltage circuit 1 is similar to that of FIG. 1 according to the first embodiment.

4.2 Mode Selection Operation

Figure 10:
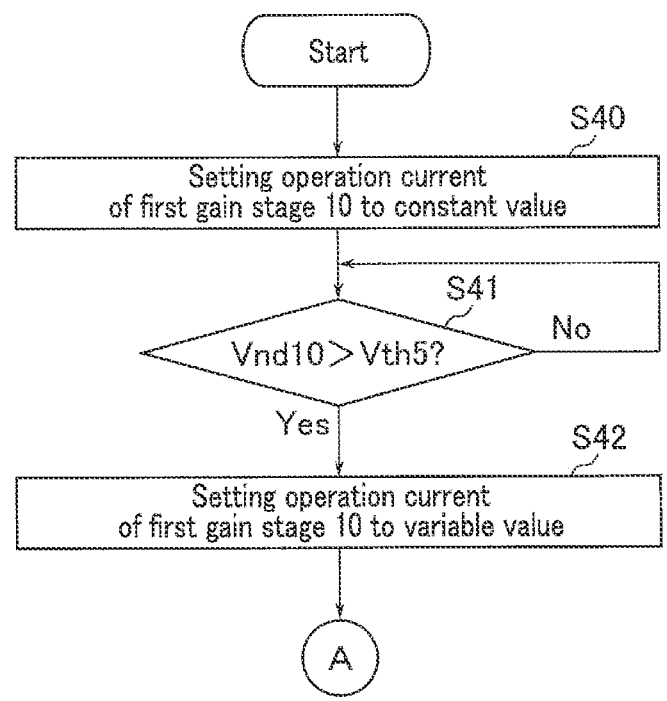
FIG. 10 is a flowchart showing a mode selection operation of the constant voltage circuit according to the fourth embodiment.
Figure 11:
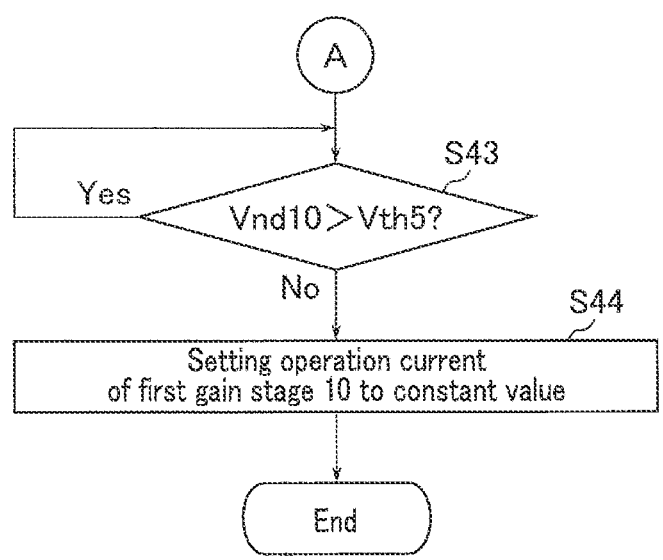
FIG. 11 is a flowchart showing the mode selection operation of the constant voltage circuit according to the fourth embodiment.

The mode selection operation of the constant voltage circuit 1 according to the present embodiment will be described with reference to FIG. 10 and FIG. 11. FIG. 10 and FIG. 11 are each a flowchart showing a mode selection operation of the constant voltage circuit 1. In the present embodiment, in the case where the output voltage VOUT drops, the first current comparator 32 slowly changes the voltage Vnd10 of the node ND10. This causes the NMOS transistor N5 to slowly transition from the OFF state to the ON state. In other words, the operation current of the first gain stage 10 slowly changes. This causes the constant voltage circuit 1 to slowly transition from the low current consumption mode to the high-speed response mode. The following will describe, as an example, the case in which the operation current of the first gain stage 10 changes from the current I1a (constant value) to the current I1a+I1b (variable value), and thereafter changes from the current I1a+I1b to the current I1a.

The constant voltage circuit 1 sets the operation current of the first gain stage 10 to a constant value (current I1a) (S40). At the time of execution of S40, the first voltage monitor circuit 30a sets the voltage Vnd10 to a voltage corresponding to the amount of drop in output voltage VOUT. The NMOS transistor N5 is turned to the OFF state based on the voltage Vnd10.

In the case where the voltage Vnd10 controlled by the first current comparator 32 is greater than the threshold voltage Vth5 of the NMOS transistor N5 (S41_Yes), the NMOS transistor N5 is turned to the ON state. As a result, the constant voltage circuit 1 sets the operation current of the first gain stage 10 to a variable value (current I1a+I1b) (S42). On the other hand, in the case where the voltage Vnd10 is smaller than or equal to the threshold voltage Vth5 (S41_No), the NMOS transistor N5 maintains the OFF state. That is, the constant voltage circuit 1 maintains the operation current of the first gain stage 10 to the constant value (current I1a).

In the case where the voltage Vnd10 controlled by the first current comparator 32 is greater than the threshold voltage Vth5 of the NMOS transistor N5 (S43_Yes), the NMOS transistor N5 maintains the ON state. That is, the constant voltage circuit 1 maintains the operation current of the first gain stage 10 to the variable value (current I1a+I1b). On the other hand, in the case where the voltage Vnd10 is smaller than or equal to the threshold voltage Vth5 (S43_No), the NMOS transistor N5 is turned to the OFF state. As a result, the constant voltage circuit 1 sets the operation current of the first gain stage 10 to the constant value (current I1a) (S44).

4.3 Advantageous Effect

The configuration according to the present embodiment produces an advantageous effect similar to that described in the first embodiment.

In the constant voltage circuit 1 according to the present embodiment, the first current comparator 32 can control the voltage Vnd10 of the node ND10 in such a manner that a voltage value of the voltage Vnd10 becomes greater as the amount of drop in output voltage VOUT is larger, and becomes smaller as the amount of drop in output voltage VOUT becomes smaller. Accordingly, in the case where the voltage Vnd10 exceeds the threshold voltage Vth5, thereby turning the NMOS transistor N5 to the ON state, a current corresponding to the voltage Vnd10 flows through the NMOS transistor N5. That is, the operation current of the first gain stage 10 can be made variable in accordance with the amount of drop in output voltage VOUT. As the amount of drop in output voltage VOUT becomes larger, the operation current of the first gain stage 10 becomes greater. As the amount of drop in output voltage VOUT becomes smaller, the operation current of the first gain stage 10 becomes smaller.

5. Fifth Embodiment

The constant voltage circuit 1 according to a fifth embodiment will be described. The constant voltage circuit 1 according to the present embodiment differs from the fourth embodiment in terms of the configuration of the first gain stage 10 and the first current comparator 32. The flowchart showing the mode selection operation is similar to those of FIG. 10 and FIG. 11 according to the fourth embodiment. Hereinafter, the following description will in principle concentrate on the features different from the fourth embodiment.

5.1 Circuit Configuration of Constant Voltage Circuit 1

A circuit configuration of the constant voltage circuit 1 according to the present embodiment will be described with reference to FIG. 12. FIG. 12 is a circuit diagram showing an example of the constant voltage circuit 1.

The NMOS transistor N5 shown in FIG. 9 according to the fourth embodiment is eliminated from the first gain stage 10. The first gain stage 10 further includes NMOS transistors N5-1 to N5-$k$ (where k is an integer greater than or equal to 1).

The NMOS transistors N5-1 to N5-$k$ are coupled in series. One end of the NMOS transistors N5-1 to N5-$k$ coupled in series is coupled to the node ND5. The other end of the NMOS transistors N5-1 to N5-$k$ coupled in series is coupled to the node ND2. Each of gates of the NMOS transistors N5-1 to N5-$k$ is coupled to the node ND10. Each of the NMOS transistors N5-1 to N5-$k$ operates based on the voltage Vnd10 of the node ND10. Since the NMOS transistors N5-1 to N5-$k$ are coupled in series, the current I1$b$ decreases in gain. That is, the current I1$b$ becomes smaller than in the case in which the NMOS transistors N5-1 to N5-$k$ are not coupled in series.

The NMOS transistors Tn4-1 to Tn4-$m$ and Tn5-1 to Tn5-$m$, and the current source 34 shown in FIG. 9 according to the fourth embodiment are eliminated from the first current comparator 32. The first current comparator 32 further includes a resistance element R1.

One end of the resistance element R1 is coupled to the node ND10, and the other end is coupled to the node ND2. The resistance element R1 may be a variable resistance.

In the first current comparator 32, the PMOS transistor Tp2 is made shorter in gate length L than the PMOS transistor Tp1. In this case, the channel-length modulation effects of the PMOS transistor Tp2 cause the current I3$ac$ to rise more than in the case in which the gate length L is long, so that the voltage Vnd10 of the node ND10 rises. By this, the first current comparator 32 slowly changes the voltage Vnd10 of the node ND10. Accordingly, the voltage Vnd10 takes a voltage value ranging between the voltage VSS and the voltage VIN. As the amount of drop in output voltage VOUT becomes larger, the voltage Vnd10 becomes greater. As the amount of drop in output voltage VOUT becomes smaller, the voltage Vnd10 becomes smaller.

Each of the NMOS transistors N5-1 to N5-$k$ is turned to the ON state when the voltage Vnd10 exceeds the threshold voltage Vth5 of each of the NMOS transistors N5-1 to N5-$k$, so that the current I1$b$ corresponding to the voltage Vnd10 flows through the first gain stage 10.

The rest of the configuration of the constant voltage circuit 1 is similar to that of FIG. 9 according to the fourth embodiment.

5.2 Advantageous Effect

The configuration according to the present embodiment produces an advantageous effect similar to that described in the fourth embodiment.

6. Sixth Embodiment

The constant voltage circuit 1 according to a sixth embodiment will be described. The constant voltage circuit 1 according to the present embodiment differs from the fourth embodiment in terms of the configuration of the first current comparator 32. The flowchart showing the mode selection operation is similar to those of FIG. 10 and FIG. 11 according to the fourth embodiment. Hereinafter, the following description will in principle concentrate on the features different from the fourth embodiment.

6.1 Circuit Configuration of Constant Voltage Circuit 1

A circuit configuration of the constant voltage circuit 1 according to the present embodiment will be described with reference to FIG. 13. FIG. 13 is a circuit diagram showing an example of the constant voltage circuit 1.

The NMOS transistors Tn4-1 to Tn4-$m$ and Tn5-1 to Tn5-$m$, and the current source 34 shown in FIG. 9 according to the fourth embodiment are eliminated from the first current comparator 32. The first current comparator 32 further includes an NMOS transistor Tn6.

One end and a gate of the NMOS transistor Tn6 are coupled to the node ND10, and the other end is coupled to the node ND2. The gate of the NMOS transistor N5 is coupled to the node ND10. That is, the NMOS transistors Tn6 and N5 form a current mirror.

In the first current comparator 32, when the current I3$ac$ flows, the voltage Vnd10 of the node ND10 rises, thereby causing the current I3$ac$ to flow through the NMOS transistor Tn6. By this, the first current comparator 32 slowly changes the voltage Vnd10 of the node ND10. Accordingly, the voltage Vnd10 takes a voltage value ranging between the voltage VSS and the voltage VIN. As the amount of drop in output voltage VOUT becomes larger, the voltage Vnd10 becomes greater. As the amount of drop in output voltage VOUT becomes smaller, the voltage Vnd10 becomes smaller.

The NMOS transistor N5 is turned to the ON state when the voltage Vnd10 exceeds the threshold voltage Vth5 of the NMOS transistor N5, so that the current I1$b$ corresponding to the voltage Vnd10, namely, a current obtained by multiplying the current I3$ac$ by a mirror ratio, flows through the first gain stage 10.

The rest of the configuration of the constant voltage circuit 1 is similar to that of FIG. 9 according to the fourth embodiment.

6.2 Advantageous Effect

The configuration according to the present embodiment produces an advantageous effect similar to that described in the fourth embodiment.

7. Seventh Embodiment

The constant voltage circuit 1 according to the seventh embodiment will be described. The constant voltage circuit 1 according to the present embodiment differs from the fourth embodiment in terms of including the second gain stage 50. Hereinafter, the following description will in principle concentrate on the features different from the fourth embodiment.

7.1 Circuit Configuration of Constant Voltage Circuit 1

A circuit configuration of the constant voltage circuit 1 according to the present embodiment will be described with reference to FIG. 14. FIG. 14 is a circuit diagram showing an example of the constant voltage circuit 1.

The constant voltage circuit 1 further includes the second gain stage 50.

The NMOS transistors N6 and N7 shown in FIG. 8 according to the third embodiment are eliminated from the second gain stage 50. The second gain stage 50 further includes the current sources 51.

One end of the current source 51 is coupled to the node ND13, and the other end is coupled to the node ND2. The current I5a flows from the current source 51 to the node ND2.

The rest of the configuration of the second gain stage 50 is similar to that of FIG. 8 according to the third embodiment.

The rest of the configuration of the constant voltage circuit 1 is similar to that of FIG. 9 according to the fourth embodiment.

The first voltage monitor circuit 30a may be the first voltage monitor circuit 30a according to the fifth embodiment or the sixth embodiment.

7.2 Mode Selection Operation

The mode selection operation of the constant voltage circuit 1 according to the present embodiment will be described. The flowchart showing the mode selection operation of the constant voltage circuit 1 according to the present embodiment differs from those of FIG. 10 and FIG. 11 according to the fourth embodiment in that the operation of the second gain stage 50 is added. Hereinafter, the mode selection operation of the constant voltage circuit 1 will be described with reference to FIG. 10 and FIG. 11.

In S40 shown in FIG. 10, the constant voltage circuit 1 sets the operation current of the first gain stage 10 to a constant value (current I1a) and sets the operation current of the second gain stage 50 to a constant value (current I5a).

In S41 shown in FIG. 10, in the case of the voltage Vnd10 being greater than the threshold voltage Vth5 of the NMOS transistor N5 or being greater than the threshold voltage Vth8 of the NMOS transistor N8 (S41_Yes), one of the NMOS transistors N5 and N8, which exceeds the threshold voltage, is turned to the ON state. As a result, the constant voltage circuit 1 sets the operation current of the first gain stage 10 to the variable value (current I1a+I1b) and sets the operation current of the second gain stage 50 to a variable value (current I5a+I5b) (S42). On the other hand, in the case of the voltage Vnd10 being smaller than or equal to both of the threshold voltage Vth5 and the threshold voltage Vth8 (S41_No), the NMOS transistors N5 and N8 maintain the OFF state. That is, the constant voltage circuit 1 maintains the operation current of the first gain stage 10 at the constant value (current I1a) and maintains the operation current of the second gain stage 50 at the constant value (current I5a).

In S43 shown in FIG. 11, in the case of the voltage Vnd10 being greater than the threshold voltage Vth5 of the NMOS transistor N5 or being greater than the threshold voltage Vth8 of the NMOS transistor N8 (S43_Yes), one of the NMOS transistors N5 and N8, which exceeds the threshold voltage, maintains the ON state. That is, the constant voltage circuit 1 maintains the operation current of the first gain stage 10 at the variable value (current I1a+I1b) and the operation current of the second gain stage 50 at the variable value (current I5a+I5b). On the other hand, in the case of the voltage Vnd10 being smaller than or equal to both of the threshold voltage Vth5 and the threshold voltage Vth8 (S43_No), the NMOS transistors N5 and N8 are turned to the OFF state. As a result, the constant voltage circuit 1 sets the operation current of the first gain stage 10 to the constant value (current I1a) and sets the operation current of the second gain stage 50 to the constant value (current I5a) (S44).

7.3 Advantageous Effect

The configuration according to the present embodiment produces an advantageous effect similar to that described in the fourth embodiment.

8. Eighth Embodiment

The constant voltage circuit 1 according to an eighth embodiment will be described. The constant voltage circuit 1 according to the present embodiment differs from the first embodiment in terms of including the second voltage monitor circuit 60. The constant voltage circuit 1 according to the present embodiment differs from the first embodiment in terms of the configuration of the first gain stage 10. Hereinafter, the following description will in principle concentrate on the features different from the first embodiment.

8.1 Circuit Configuration of Constant Voltage Circuit 1

A circuit configuration of the constant voltage circuit 1 according to the present embodiment will be described with reference to FIG. 15. FIG. 15 is a circuit diagram showing an example of the constant voltage circuit 1. FIG. 15 omits the interconnect between the first voltage monitor circuit 30 and the nodes ND1 and ND2 shown in FIG. 1 according to the first embodiment.

The constant voltage circuit 1 further includes the second voltage monitor circuit 60.

The second voltage monitor circuit 60 monitors a rise in output voltage VOUT, and controls a voltage Vnd21 of a node ND21 in accordance with the monitored rise. The second voltage monitor circuit 60 includes a second voltage-current conversion circuit 61, a second current comparator 62, PMOS transistors Tp4 to Tp6, and NMOS transistors Tn8 and Tn10.

The second voltage-current conversion circuit 61 converts, into a current, the amount of rise in the AC component of the output voltage VOUT from which the DC component has been cut by the capacitance element CC. The second voltage-current conversion circuit 61 includes an NMOS transistor Tn7.

One end and a gate of the NMOS transistor Tn7 are coupled to the node ND11, and the other end is coupled to the node ND2. For example, in the case where there is no fluctuation in the AC component of the output voltage VOUT or the rise in the AC component of the output voltage VOUT is slow, the NMOS transistor Tn7 is turned to the OFF state or the ON state based on a voltage difference between the gate and the source. Therefore, a current I6a does not flow or the micro current I6a flows through the NMOS transistor Tn7. On the other hand, in the case where the rise in the AC component of the output voltage VOUT is sharp, a voltage of the node ND11 rises, thereby increasing the voltage difference between the gate and the source, so that the NMOS transistor Tn7 is turned to the ON state. Therefore, the current I6a flows through the NMOS transistor Tn7. Herein, as the capacitance element CC becomes greater in capacitance value, the current I6a becomes greater.

One end of the PMOS transistor Tp4 is coupled to the node ND1, and the other end and a gate are coupled to a node ND22.

One end of the NMOS transistor Tn8 is coupled to the node ND22, the other end is coupled to the node ND2, and a gate is coupled to the node ND11. That is, the NMOS transistors Tn7 and Tn8 form a current mirror.

A current I6ac' corresponding to the current I6a flows through the PMOS transistor Tp4 and the NMOS transistor Tn8.

The second current comparator 62 compares a current corresponding to the current I6a converted by the second voltage-current conversion circuit 61 with a reference current to be described later, and controls the voltage Vnd21 in accordance with a difference between these currents. The second current comparator 62 includes a PMOS transistor Tp3 and an NMOS transistor Tn9.

One end of the PMOS transistor Tp3 is coupled to the node ND1, the other end is coupled to the node ND21, and a gate is coupled to the node ND22. That is, the PMOS transistors Tp4 and Tp3 form a current mirror.

One end of the NMOS transistor Tn9 is coupled to the node ND21, the other end is coupled to the node ND2, and a gate is coupled to the node ND6. That is, the NMOS transistors N3 and Tn9 form a current mirror.

For example, in the case where there is no fluctuation in the AC component of the output voltage VOUT or the rise in the AC component of the output voltage VOUT is slow, as described in the above, the current I6a does not flow or the micro current I6a flows through the NMOS transistor Tn7. In the case where the current I6a does not flow, the PMOS transistor Tp4 and the NMOS transistor Tn8 are turned to the OFF state. The PMOS transistor Tp3 is turned to the OFF state. Thus, the current I6ac' corresponding to the current I6a does not flow through the PMOS transistor Tp4 and the NMOS transistor Tn8. A current I6ac corresponding to the current I6ac' does not flow through the PMOS transistor Tp3. On the other hand, a current I6b corresponding to the current I1c flows through the NMOS transistor Tn9. In the case where the current I6a flows, the PMOS transistor Tp4 and the NMOS transistor Tn8 are turned to the ON state. The PMOS transistor Tp3 is turned to the ON state. Thus, the current I6$_{ac}$' momentarily flows through the PMOS transistor Tp4 and the NMOS transistor Tn8. The current I6ac momentarily flows through the PMOS transistor Tp3. On the other hand, the current I6b flows through the NMOS transistor Tn9. The current I6ac and the current I6b ultimately take the same current value.

On the other hand, in the case where the AC component of the output voltage VOUT rises sharply, as described in the above, the current I6a flows through the NMOS transistor Tn7. In this case, the PMOS transistor Tp3 is turned to the ON state, so that the current I6ac momentarily flows through the PMOS transistor Tp3. On the other hand, the current I6b flows through the NMOS transistor Tn9.

The second current comparator 62 compares the current I6ac with the current I6b. The current I6b is used as a reference voltage to be compared with the current I6ac.

In the case where the current I6ac does not flow, the voltage Vnd21 is set to a voltage approximate to the voltage VSS (is set to the "L" level). In other words, the second current comparator 62 sets the voltage Vnd21 to the "L" level.

In the case where the current I6ac flows and it is greater than the current I6b, the voltage Vnd21 rises. Thus, in this case, the voltage Vnd21 is set to a voltage approximate to the voltage VIN (is set to the "H" level). In other words, the second current comparator 62 sets the voltage Vnd21 to the "H" level. This is the case in which, for example, the AC component of the output voltage VOUT rises sharply. Herein, the voltage approximate to the voltage VIN is, for example, a voltage greater than a threshold voltage of the NMOS transistor N11 to be described later. In the case where the current I6ac flows and it is smaller than the current I6b, the voltage Vnd21 drops. Thus, in this case, the voltage Vnd21 is set to a voltage approximate to the voltage VSS (is set to the "L" level). In other words, the second current comparator 62 sets the voltage Vnd21 to the "L" level. This is the case in which, for example, there is no fluctuation in the AC component of the output voltage VOUT or the rise in the AC component of the output voltage VOUT is slow. Herein, the voltage approximate to the voltage VSS is, for example, a voltage smaller than a threshold voltage of the NMOS transistor N11 to be described later. Furthermore, in the case where the current I6ac flows and it is equal to the current I6b, the voltage Vnd21 is maintained as a voltage approximate to the voltage VSS (maintained at the "L" level). In other words, the second current comparator 62 maintains the voltage Vnd21 at the "L" level.

One end of the PMOS transistor Tp5 is coupled to the node ND1, and the other end and a gate are coupled to a node ND20.

One end of the NMOS transistor Tn10 is coupled to the node ND20, the other end is coupled to the node ND2, and a gate is coupled to the node ND6. That is, the NMOS transistors N3 and Tn10 form a current mirror.

A current I6d corresponding to the current I1c flows through the PMOS transistor Tp5 and the NMOS transistor Tn10.

The PMOS transistor Tp6 is provided in order to adjust the current I6a. One end of the PMOS transistor Tp6 is coupled to the node ND1, the other end is coupled to the node ND11, and a gate is coupled to the node ND20. That is, the PMOS transistors Tp5 and Tp6 form a current mirror. The current I6c corresponding to the current I6d flows through the PMOS transistor Tp6. This results in the current I6a being biased by the current I6c.

The first gain stage 10 further includes NMOS transistors N10 and N11.

One end of the NMOS transistor N10 is coupled to a node ND19, the other end is coupled to the node ND2, and a gate is coupled to the node ND6. That is, the NMOS transistors N3 and N10 form a current mirror.

One end of the NMOS transistor N11 is coupled to the node ND5, the other end is coupled to the node ND19, and a gate is coupled to the node ND21. The NMOS transistor N11 operates based on the voltage Vnd21 of the node ND21.

For example, the voltage Vnd21 is set to the "H" level in the case of the high-speed response mode and is set to the "L" level in the case of the low current consumption mode. For example, the NMOS transistor N11 is turned to the ON state in the case of the voltage Vnd21 being at the "H" level, and is turned to the OFF state in the case of the voltage Vnd21 being at the "L" level. With the NMOS transistor N11 being in the ON state, a current I1d corresponding to the current I1c flows through the NMOS transistors N10 and N11. For example, the current I1d is a current greater than the current I1a. In the case of the low current consumption mode, the operation current I1a flows through the first gain stage 10. In the case of the high-speed response mode, the operation current (I1a+I1d) flows through the first gain stage 10. The operation current (I1a+I1d) is greater than the operation current I1a. Therefore, the high-speed response mode enables the output stage 20 in the subsequent stage to be driven at a higher speed than the low current consumption mode.

8.2 Mode Selection Operation

Figure 16:
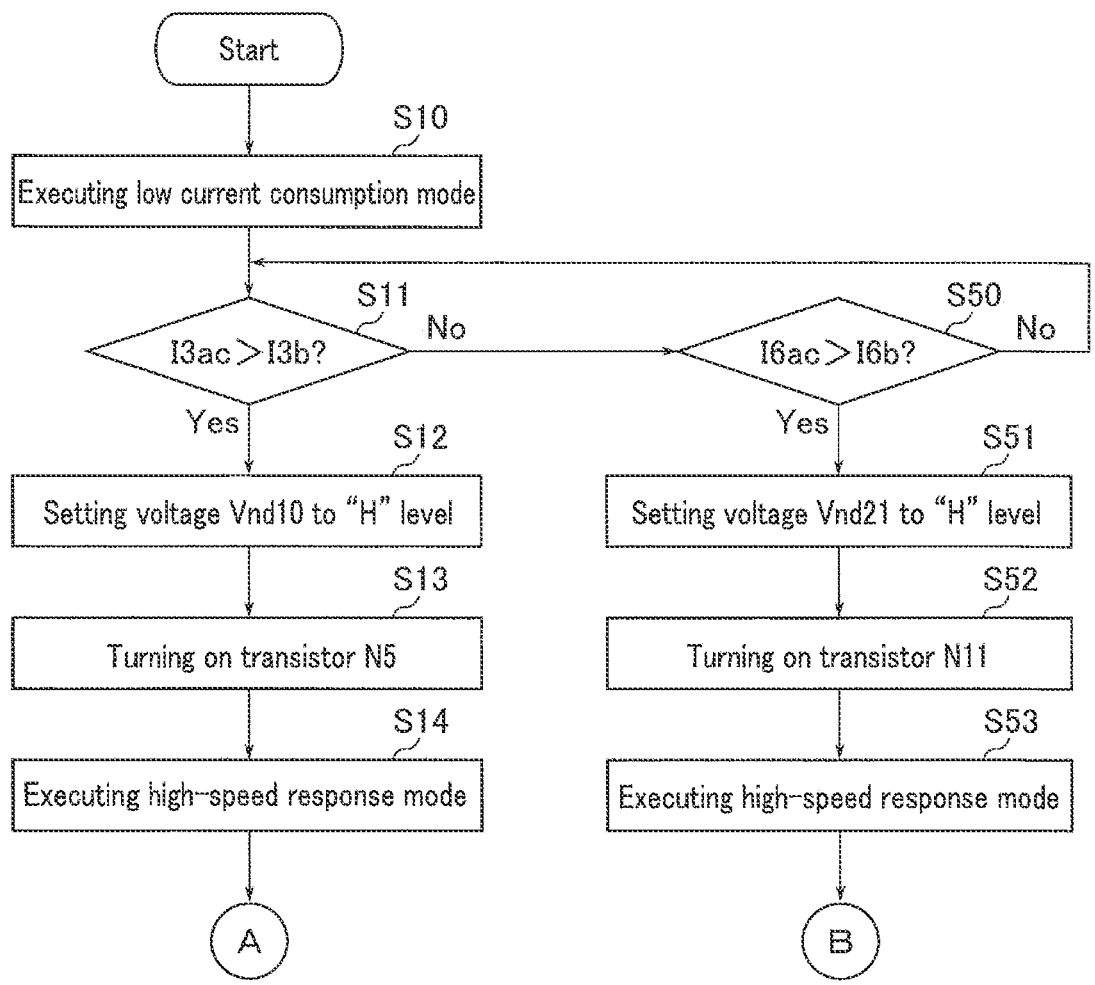
FIG. 16 is a flowchart showing a mode selection operation of the constant voltage circuit according to the eighth embodiment.
Figure 17:
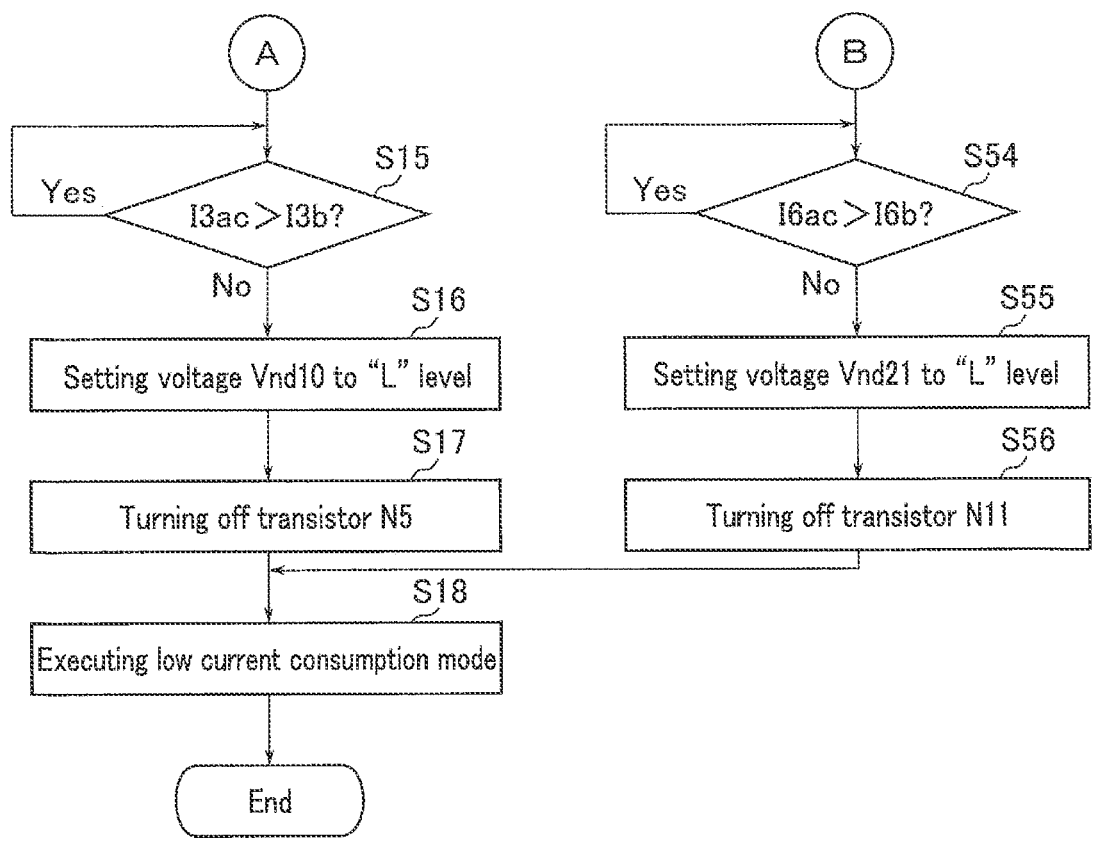
FIG. 17 is a flowchart showing the mode selection operation of the constant voltage circuit according to the eighth embodiment.

The mode selection operation of the constant voltage circuit 1 according to the present embodiment will be described with reference to FIG. 16 and FIG. 17. FIG. 16 and FIG. 17 are each a flowchart showing a mode selection operation of the constant voltage circuit 1. The operation from S50 to S56 is added to the operation from S10 to S18 in FIG. 2 and FIG. 3 according to the first embodiment. The operation from S10 to S18 is similar to those shown in FIG. 2 and FIG. 3 according to the first embodiment. Hereinafter, the following description will in principle concentrate on the operation from S50 to S56.

After the execution of S10, the voltages Vnd10 and Vnd21 are at the "L" level. The NMOS transistors N5 and N11 are turned to the OFF state.

The second current comparator 62 compares the current I6ac with the current I6b. In the case of the current I6ac being smaller than or equal to the current I6b (S50_No), the second current comparator 62 maintains the voltage Vnd21 at the "L" level. That is, the constant voltage circuit 1 maintains the low current consumption mode. On the other hand, in the case of the current I6ac being greater than the current I6b (S50_Yes), the second current comparator 62 sets the voltage Vnd21 to the "H" level (S51).

The NMOS transistor N11 is turned to the ON state based on the voltage Vnd21 at the "H" level (S52). As a result, the constant voltage circuit 1 executes the high-speed response mode (S53).

Next, the second current comparator 62 compares the current I6ac with the current I6b. In the case of the current I6ac being greater than the current I6b (S54_Yes), the second current comparator 62 maintains the voltage Vnd21 at the "H" level. That is, the constant voltage circuit 1 maintains the high-speed response mode. On the other hand, in the case of the current I6ac being smaller than or equal to the current I6b (S54_No), the second current comparator 62 sets the voltage Vnd21 to the "L" level (S55).

The NMOS transistor N11 is turned to the OFF state based on the voltage Vnd21 at the "L" level (S56). As a result, the constant voltage circuit 1 executes the low current consumption mode (S18).

8.3 Advantageous Effect

The configuration according to the present embodiment produces an advantageous effect similar to that described in the first embodiment.

Figure 18:
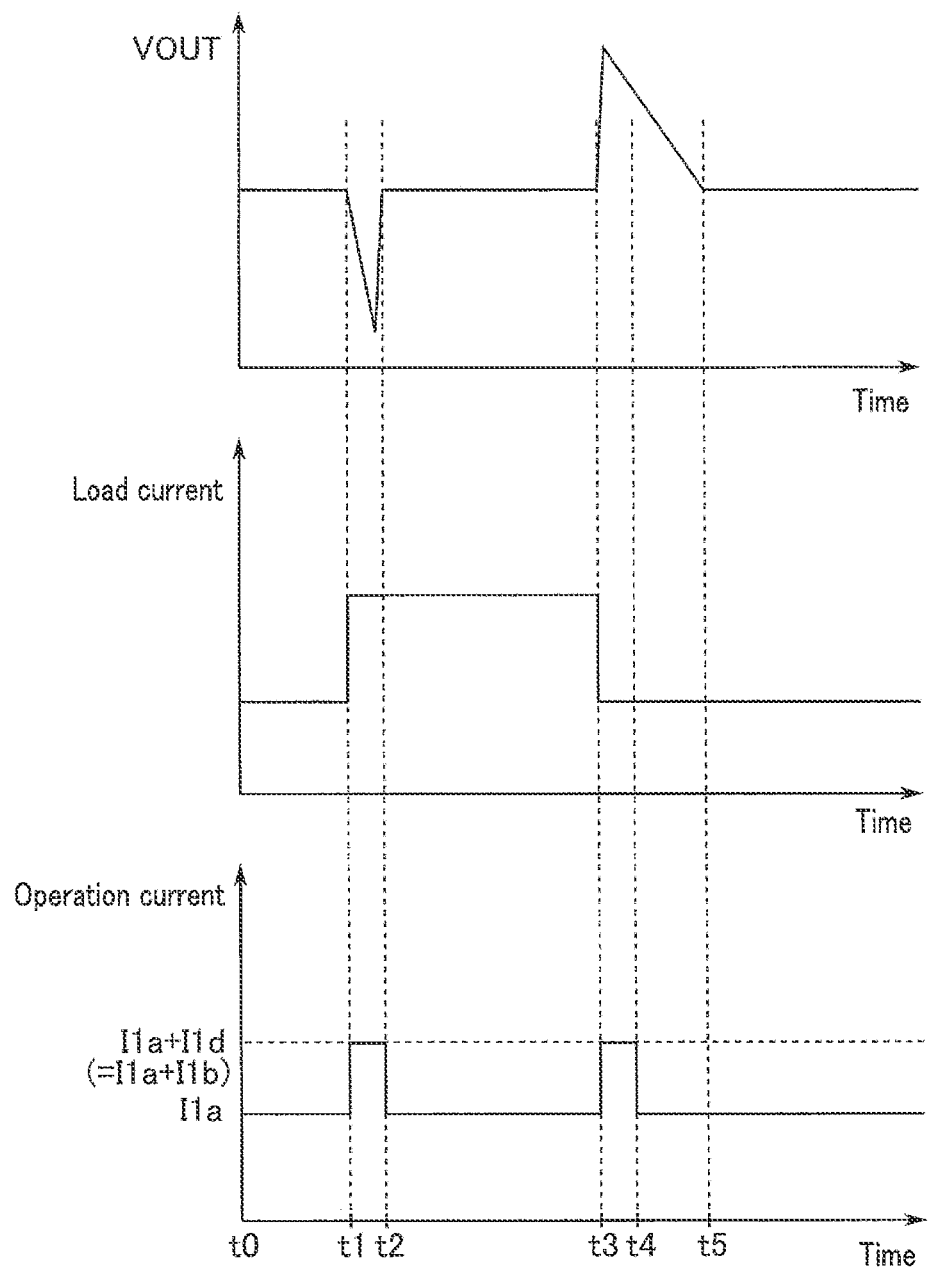
FIG. 18 is a diagram illustrating the advantageous effect of the constant voltage circuit according to the eighth embodiment.

Furthermore, the configuration according to the present embodiment can realize the high-speed response even in the case where the output voltage VOUT rises. Hereinafter, this advantageous effect will be described with reference to FIG. 18. FIG. 18 is a diagram illustrating the advantageous effect of the constant voltage circuit 1 according to the present embodiment. In FIG. 18, the period from time t0 to time t2 is similar to that shown in FIG. 4 according to the first embodiment. Furthermore, FIG. 18 shows an exemplary case in which the current I1b and the current I1d are the same.

As shown in FIG. 18, in the constant voltage circuit 1 according to the present embodiment, a period from time t2 to time t3 shows that the output voltage VOUT exhibits a voltage value in a steady state, and the operation current of the first gain stage 10 is the current I1a. Assume that a load current drops at time t3. In this case, at time t3, the output voltage VOUT rises sharply from the voltage value in the steady state. However, at time t5, the output voltage VOUT is restored to the voltage value in the steady state. The reason for this is as follows. At time t3, the second voltage-current conversion circuit 61 converts the amount of the sharp rise in the AC component of the output voltage VOUT into the current I6a, the second voltage-current conversion circuit 62 controls the voltage Vnd21 of the node ND21 to the "H" level based on the current I1iac corresponding to the current I6a, and the NMOS transistor N11 is turned to the ON state. This increases the operation current to I1a+I1d. At time t4, the operation current is restored to I1a. The reason for this is as follows. At time t4, the second current comparator 62 controls the voltage Vnd21 of the node ND21 to the "L" level, and the NMOS transistor N11 is turned to the OFF state. This decreases the operation current to I1a.

As described in the above, in the case where the AC component of the output voltage VOUT rises sharply, the constant voltage circuit 1 according to the present embodiment can increase the operation current of the first gain stage 10 based on the amount of such a rise. This can reduce a time until the output voltage VOUT is restored to the steady state. That is, the constant voltage circuit 1 according to the present embodiment can realize the high-speed response. As a matter of course, the present embodiment is applicable to the second embodiment.

9. Ninth Embodiment

The constant voltage circuit 1 according to a ninth embodiment will be described. The constant voltage circuit 1 according to the present embodiment differs from the eighth embodiment in terms of the configuration of the first gain stage 10 and the second voltage monitor circuit 60. In order to distinguish from the eighth embodiment, the second voltage monitor circuit 60 will be referred to as a second voltage monitor circuit 60a. Hereinafter, the following description will in principle concentrate on the features different from the eighth embodiment.

9.1 Circuit Configuration of Constant Voltage Circuit 1

A circuit configuration of the constant voltage circuit 1 according to the present embodiment will be described with reference to FIG. 19. FIG. 19 is a circuit diagram showing an example of the constant voltage circuit 1. FIG. 19 omits the interconnect between the first voltage monitor circuit 30 and the nodes ND1 and ND2.

The NMOS transistor N10 shown in FIG. 15 according to the eighth embodiment is eliminated from the first gain stage 10.

The NMOS transistor Tn9 in FIG. 15 according to the eighth embodiment is eliminated from the second current comparator 62. The second current comparator 62 further includes the NMOS transistors Tn11-1 to Tn11-$q$ (where $q$ is an integer greater than or equal to 1) and Tn12-1 to Tn12-$q$, and the current source 64.

The NMOS transistors Tn11-1 to Tn11-$q$ are coupled in series. One end of the NMOS transistors Tn11-1 to Tn11-$q$ coupled in series is coupled to a node ND23. The other end of the NMOS transistors Tn11-1 to Tn11-$q$ coupled in series is coupled to the node ND2. Each of gates of the NMOS transistors Tn11-1 to Tn11-$q$ is coupled to the node ND23.

The input voltage VIN is applied to one end of the current source 64. The other end of the current source 64 is coupled to the node ND23. A current I6$e$ flows from the current source 64 to the NMOS transistors Tn11-1 to Tn11-$q$.

The NMOS transistors Tn12-1 to Tn12-$q$ are coupled in series. One end of the NMOS transistors Tn12-1 to Tn12-$q$ coupled in series is coupled to the node ND21. The other end of the NMOS transistors Tn12-1 to Tn12-$q$ coupled in series is coupled to the node ND2. Each of gates of the NMOS transistors Tn12-1 to Tn12-$q$ is coupled to the node ND23. That is, the NMOS transistors Tn11-1 to Tn11-$q$ and the NMOS transistors Tn12-1 to Tn12-$q$ form the current mirror. The current I6$b$ corresponding to the current I6$e$ flows through the NMOS transistors Tn12-1 to Tn12-$q$. Since the NMOS transistors Tn12-1 to Tn12-$q$ are coupled in series, the current I6$b$ is high in constant current characteristic.

In the second current comparator 62, the PMOS transistor Tp3 is made shorter in gate length L than the PMOS transistor Tp4. In this case, the channel-length modulation effects of the PMOS transistor Tp3 cause the current I6$ac$ to rise more than in the case in which the gate length L is long. When the current I6$ac$ rises, the voltage Vnd21 of the node ND21 rises. On the other hand, when the voltage Vnd21 rises, the current I6$b$ rises. Therefore, the voltage Vnd21 rises gradually. In other words, the second current comparator 62 slowly changes the voltage Vnd21 of the node ND21. Accordingly, the voltage Vnd21 takes a voltage value ranging between the voltage VSS and the voltage VIN. As the amount of rise in output voltage VOUT becomes larger, the voltage Vnd21 becomes greater. As the amount of rise in output voltage VOUT becomes smaller, the voltage Vnd21 becomes smaller. In the case where the current I6$ac$ does not flow, the voltage Vnd21 is set to a voltage approximate to the voltage VSS.

The NMOS transistor N11 is turned to the ON state when the voltage Vnd21 exceeds the threshold voltage Vth11 of the NMOS transistor N11, so that the current I1$d$ corresponding to the voltage Vnd21 flows through the first gain stage 10.

The rest of the configuration of the constant voltage circuit 1 is similar to that of FIG. 15 according to the eighth embodiment.

9.2 Mode Selection Operation

The constant voltage circuit 1 according to the present embodiment will be described. The flowchart illustrating the mode selection operation of the constant voltage circuit 1 according to the present embodiment corresponds to those in FIG. 16 and FIG. 17 according to the eighth embodiment modified by replacing S50 to S56 with S40 to S44 in FIG. 10 and FIG. 11 according to the fourth embodiment and replacing "Vnd10" and "Vth5" in S41 and S43 with "Vnd21" and "Vth11", respectively. The constant voltage circuit 1 sets the operation current of the first gain stage 10 to the constant value (current I1$a$) in S40 and S44, and sets the operation current of the first gain stage 10 to the variable value (current I1$a$+I1$d$) in S42. After the execution of S44, the constant voltage circuit 1 terminates the processing.

9.3 Advantageous Effect

The configuration according to the present embodiment produces an advantageous effect similar to that of the eighth embodiment.

In the constant voltage circuit 1 according to the present embodiment, the second current comparator 62 can control the voltage Vnd21 of the node ND21 in such a manner that a voltage value of the voltage Vnd21 becomes greater as the amount of rise in output voltage VOUT is larger, and becomes smaller as the amount of rise in output voltage VOUT becomes smaller. Accordingly, in the case where the voltage Vnd21 exceeds the threshold voltage Vth11, thereby turning the NMOS transistor N11 to the ON state, a current corresponding to the voltage Vnd21 flows through the NMOS transistor N11. That is, the operation current of the first gain stage 10 can be made variable in accordance with the amount of rise in output voltage VOUT. As the amount of rise in output voltage VOUT becomes larger, the operation current of the first gain stage 10 becomes greater. As the amount of rise in output voltage VOUT becomes smaller, the operation current of the first gain stage 10 becomes smaller.

10. Tenth Embodiment

The constant voltage circuit 1 according to a tenth embodiment will be described. The constant voltage circuit 1 according to the present embodiment differs from the ninth embodiment in that the first voltage monitor circuit 30 is replaced with the first voltage monitor circuit 30$a$. The constant voltage circuit 1 according to the present embodiment differs from the ninth embodiment in terms of the configuration of the first gain stage 10. Hereinafter, the following description will in principle concentrate on the features different from the ninth embodiment.

10.1 Circuit Configuration of Constant Voltage Circuit 1

A circuit configuration of the constant voltage circuit 1 according to the present embodiment will be described with reference to FIG. 20. FIG. 20 is a circuit diagram showing an example of the constant voltage circuit 1. FIG. 20 omits the interconnect between the nodes ND1 and ND2, and the first voltage monitor circuit 30$a$ and the second voltage monitor circuit 60$a$ shown in FIG. 19 according to the ninth embodiment.

The NMOS transistors N3 and N4 and the current source 12 shown in FIG. 19 according to the ninth embodiment are eliminated from the first gain stage 10.

The first voltage monitor circuit 30$a$ is similar to that of FIG. 9 according to the fourth embodiment. The first voltage monitor circuit 30$a$ may be the first voltage monitor circuit 30$a$ according to the fifth embodiment or the sixth embodiment.

The rest of the configuration of the constant voltage circuit 1 is similar to that of FIG. 19 according to the ninth embodiment.

10.2 Mode Selection Operation

The mode selection operation of the constant voltage circuit 1 according to the present embodiment will be described. The flowchart illustrating the mode selection operation of the constant voltage circuit 1 according to the present embodiment corresponds to those in FIGS. 16 and 17 according to the eighth embodiment modified by replacing S10 to S18 with S40 to S44 in FIG. 10 and FIG. 11 according to the fourth embodiment. Furthermore, the aforementioned flowchart according to the present embodiment corresponds to those in FIGS. 16 and 17 according to the eighth embodiment modified by replacing S50 to S56 with S41 to S43 in FIG. 10 and FIG. 11 according to the fourth embodiment and replacing "Vnd10" and "Vth5" in S41 and S43 with "Vnd21" and "Vth11", respectively.

10.3 Advantageous Effect

The configuration according to the present embodiment produces an advantageous effect similar to those described in the fourth embodiment and the ninth embodiment.

11. Eleventh Embodiment

The constant voltage circuit 1 according to an eleventh embodiment will be described. The constant voltage circuit 1 according to the present embodiment differs from the tenth embodiment in terms of the configuration of the first gain stage 10. Hereinafter, the following description will in principle concentrate on the features different from the tenth embodiment.

11.1 Circuit Configuration of Constant Voltage Circuit 1

A circuit configuration of the constant voltage circuit 1 according to the present embodiment will be described with reference to FIG. 21. FIG. 21 is a circuit diagram showing an example of the constant voltage circuit 1. FIG. 21 omits the interconnect between the nodes ND1 and ND2, and the first voltage monitor circuit 30a and the second voltage monitor circuit 60a.

The current source 11 shown in FIG. 20 according to the tenth embodiment is eliminated from the first gain stage 10.

The rest of the configuration of the constant voltage circuit 1 is similar to that of FIG. 20 according to the tenth embodiment.

11.2 Mode Selection Operation

The mode selection operation of the constant voltage circuit 1 according to the present embodiment will be described. The flowchart illustrating the mode selection operation of the constant voltage circuit 1 according to the present embodiment corresponds to those in FIGS. 16 and 17 according to the eighth embodiment modified by replacing S10 to S18 with S41 to S43 in FIG. 10 and FIG. 11 according to the fourth embodiment. Furthermore, the aforementioned flowchart according to the present embodiment corresponds to those in FIGS. 16 and 17 according to the eighth embodiment modified by replacing S50 to S56 with S41 to S43 in FIG. 10 and FIG. 11 according to the fourth embodiment and replacing "Vnd10" and "Vth5" in S41 and S43 with "Vnd21" and "Vth11", respectively. The constant voltage circuit 1 sets the operation current of the first gain stage 10 to the variable value (current I1b or I1d).

11.3 Advantageous Effect

The configuration according to the present embodiment produces an advantageous effect similar to that of the tenth embodiment.

The constant voltage circuit 1 according to the present embodiment enables the operation current of the first gain stage 10 to be variable without using the current source 11.

12. Twelfth Embodiment

The constant voltage circuit 1 according to a twelfth embodiment will be described. The constant voltage circuit 1 according to the present embodiment differs from the first embodiment in that a PMOS transistor is used for the input terminal of the first gain stage 10. Hereinafter, the following description will in principle concentrate on the features different from the first embodiment.

12.1 Circuit Configuration of Constant Voltage Circuit 1

The circuit configuration of the constant voltage circuit 1 according to the present embodiment will be described with reference to FIG. 22. FIG. 22 is a circuit diagram showing an example of the constant voltage circuit 1.

The first gain stage 10 includes the PMOS transistors P1, P2, and P4 to P6, the NMOS transistors N1 and N2, and the current sources 11 and 12.

One end and the gate of the NMOS transistor N1 are coupled to a node ND31, and the other end is coupled to the node ND2.

One end of the NMOS transistor N2 is coupled to a node ND32, the other end is coupled to the node ND2, and the gate is coupled to the node ND31. That is, the NMOS transistors N1 and N2 form a current mirror.

One end of the PMOS transistor P1 is coupled to a node ND30, and the other end is coupled to the node ND31. The voltage VFB is applied to the gate of the PMOS transistor P1.

One end of the PMOS transistor P2 is coupled to the node ND30, and the other end is coupled to the node ND32. The reference voltage VREF is applied to the gate of the PMOS transistor P2.

One end of the current source 11 is coupled to the node ND1, and the other end is coupled to the node ND30. The current I1a flows from the current source 11 to the node ND30.

One end of the PMOS transistor P4 is coupled to the node ND1, and the other end and a gate are coupled to a node ND33.

One end of the current source 12 is coupled to the node ND33, and the other end is coupled to the node ND2. The current I1c flows from the current source 12.

One end of the PMOS transistor P5 is coupled to the node ND1, the other end is coupled to a node ND34, and a gate is coupled to the node ND33. That is, the PMOS transistors P4 and P5 form a current mirror.

One end of the PMOS transistor P6 is coupled to the node ND34, the other end is coupled to the node ND30, and a gate is coupled to the node ND10. The PMOS transistor P6 operates based on the voltage Vnd10 of the node ND10.

For example, the voltage Vnd10 is set to the "L" level in the case of the high-speed response mode and is set to the "H" level in the case of the low current consumption mode. For example, the PMOS transistor P6 is turned to the ON state in the case of the voltage Vnd10 being at the "L" level, and is turned to the OFF state in the case of the voltage Vnd10 being at the "H" level. With the PMOS transistor P6 being in the ON state, the current I1b corresponding to the current I1c flows through the PMOS transistors P5 and P6.

The node ND32 is coupled to the gate of the PMOS transistor Pp of the output stage 20. In other words, the output voltage V1 of the first gain stage 10 is applied to the gate of the PMOS transistor Pp.

The first voltage monitor circuit 30 includes the first voltage-current conversion circuit 31, the first current comparator 32, PMOS transistors Tp7 and Tp9, and NMOS transistors Tn2, Tn14, and Tn15.

One end of the PMOS transistor Tp7 is coupled to the node ND1, the other end is coupled to a node ND36, and a gate is coupled to the node ND11. That is, the PMOS transistors Tp1 and Tp7 form a current mirror.

One end and a gate of the NMOS transistor Tn14 are coupled to the node ND36, and the other end is coupled to the node ND2.

A current I3ac' corresponding to the current I3a flows through the PMOS transistor Tp7 and the NMOS transistor Tn14.

The first current comparator 32 includes a PMOS transistor Tp8 and an NMOS transistor Tn13.

One end of the PMOS transistor Tp8 is coupled to the node ND1, the other end is coupled to the node ND10, and a gate is coupled to the node ND33. That is, the PMOS transistors P4 and Tp8 form a current mirror.

One end of the NMOS transistor Tn13 is coupled to the node ND10, the other end is coupled to the node ND2, and a gate is coupled to the node ND36. That is, the NMOS transistors Tn14 and Tn13 form a current mirror.

For example, in the case where there is no fluctuation in the AC component of the output voltage VOUT or the drop in the AC component of the output voltage VOUT is slow, the current I3a does not flow or the micro current I3a flows through the PMOS transistor Tp1. In the case where the current I3a does not flow, the PMOS transistor Tp7 and the NMOS transistor Tn14 are turned to the OFF state. The NMOS transistor Tn13 is turned to the OFF state. Thus, the current I3ac' corresponding to the current I3a does not flow through the PMOS transistor Tp7 and the NMOS transistor Tn14. The current I3ac corresponding to the current I3ac' does not flow through the NMOS transistor Tn13. On the other hand, the current I3b corresponding to the current I1c flows through the PMOS transistor Tp8. In the case where the current I3a flows, the PMOS transistor Tp7 and the NMOS transistor Tn14 are turned to the ON state. The NMOS transistor Tn13 is turned to the ON state. Thus, the current I3ac' corresponding to the current I3a momentarily flows through the PMOS transistor Tp7 and the NMOS transistor Tn14. The current I3ac corresponding to the current I3ac' momentarily flows through the NMOS transistor Tn13. On the other hand, the current I3b corresponding to the current I1c flows through the PMOS transistor Tp8. The current I3ac and the current I3b ultimately take the same current value.

On the other hand, in the case where the AC component of the output voltage VOUT drops sharply, the current I3a flows through the PMOS transistor Tp1. In this case, the NMOS transistor Tn13 is turned to the ON state, so that the current I3ac momentarily flows through the NMOS transistor Tn13. On the other hand, the current I3b flows through the PMOS transistor Tp8.

The first current comparator 32 compares the current I3ac with the current I3b.

In the case where the current I3ac does not flow, the voltage Vnd10 is set to a voltage approximate to the voltage VIN (is set to the "H" level). In other words, the first current comparator 32 sets the voltage Vnd10 to the "H" level.

In the case where the current I3ac flows and it is greater than the current I3b, the voltage Vnd10 drops. Thus, in this case, the voltage Vnd10 is set to a voltage approximate to the voltage VSS (is set to the "L" level). In other words, the first current comparator 32 sets the voltage Vnd10 to the "L" level. This is the case in which, for example, the AC component of the output voltage VOUT drops sharply. In the case where the current I3ac flows and it is smaller than the current I3b, the voltage Vnd10 rises. Thus, in this case, the voltage Vnd10 is set to a voltage approximate to the voltage VIN (is set to the "H" level). In other words, the first current comparator 32 sets the voltage Vnd10 to the "H" level. This is the case in which, for example, there is no fluctuation in the AC component of the output voltage VOUT or the drop in the AC component of the output voltage VOUT is slow. Furthermore, in the case where the current I3ac flows and it is equal to the current I3b, the voltage Vnd10 is maintained as a voltage approximate to the voltage VIN (maintained at the "H" level). In other words, the first current comparator 32 maintains the voltage Vnd10 at the "H" level.

One end of the PMOS transistor Tp9 is coupled to the node ND1, the other end is coupled to a node ND35, and a gate is coupled to the node ND33. That is, the PMOS transistors P4 and Tp9 form a current mirror.

One end and a gate of the NMOS transistor Tn15 are coupled to the node ND35, and the other end is coupled to the node ND2. The gate of the NMOS transistor Tn2 is coupled to the node ND35. That is, the NMOS transistors Tn15 and Tn2 form a current mirror.

A current I3d corresponding to the current I1c flows through the PMOS transistor Tp9 and the NMOS transistor Tn15.

The current I3c corresponding to the current I3d flows through the NMOS transistor Tn2. This results in the current I3a being biased by the current I3c.

The rest of the configuration of the constant voltage circuit 1 is similar to that of FIG. 1 according to the first embodiment.

12.2 Mode Selection Operation

The mode selection operation of the constant voltage circuit 1 according to the present embodiment will be described. The flowchart illustrating the mode selection operation of the constant voltage circuit 1 according to the present embodiment corresponds to those in FIGS. 2 and 3 according to the first embodiment modified by replacing "'H' level" in S12, "N5" in S13 and S17, and "'L' level" in S16 with "'L' level", "P6", and "'H' level", respectively.

12.3 Advantageous Effect

The configuration according to the present embodiment produces an advantageous effect similar to that of the first embodiment. As a matter of course, the present embodiment is applicable to the second embodiment.

13. Thirteenth Embodiment

The constant voltage circuit 1 according to a thirteenth embodiment will be described. The constant voltage circuit 1 according to the present embodiment differs from the twelfth embodiment in terms of including the second gain stage 50. Hereinafter, the following description will in principle concentrate on the features different from the twelfth embodiment.

13.1 Circuit Configuration of Constant Voltage Circuit 1

Figure 23:
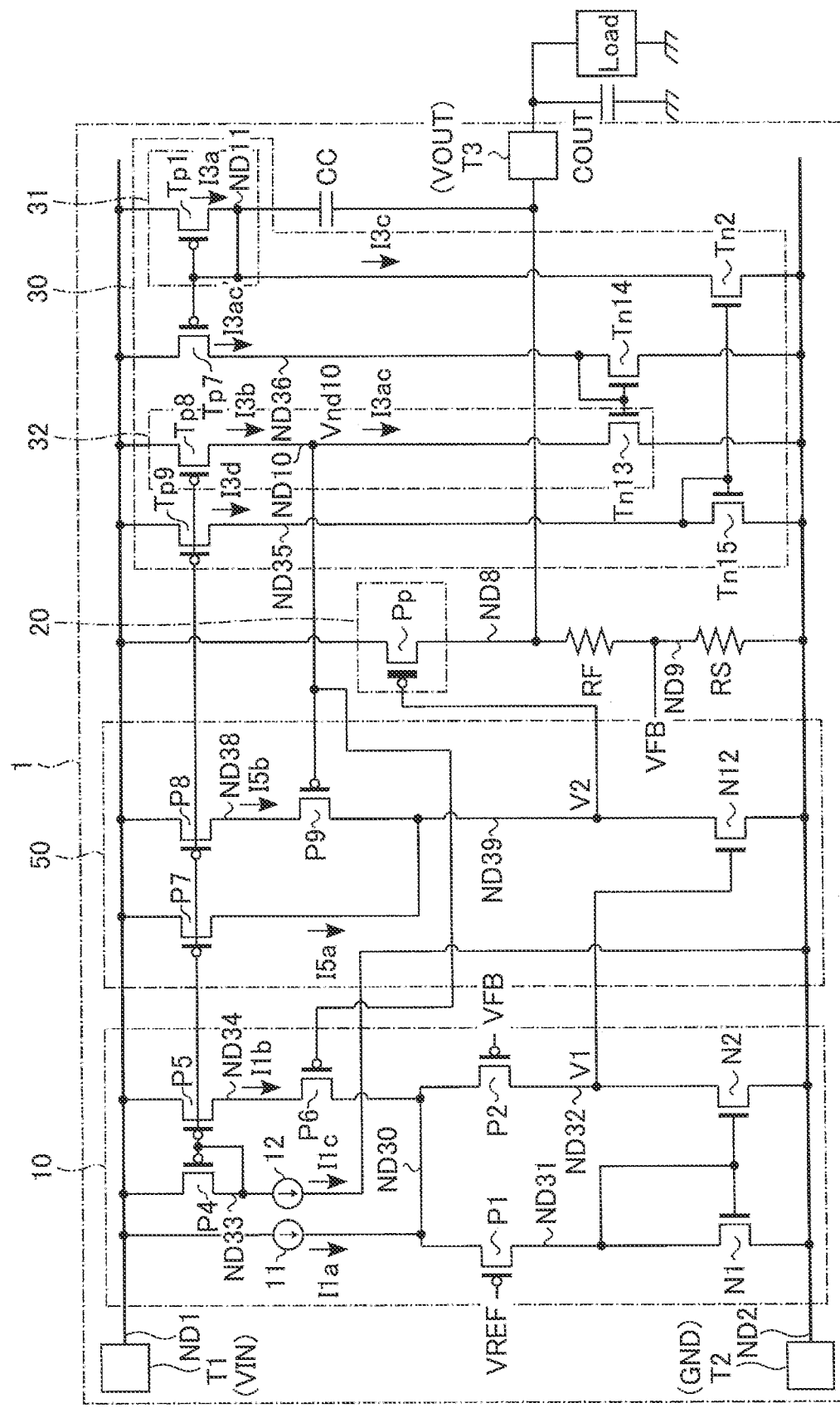
FIG. 23 is a circuit diagram showing an example of a constant voltage circuit according to a thirteenth embodiment.

The circuit configuration of the constant voltage circuit 1 according to the present embodiment will be described with reference to FIG. 23. FIG. 23 is a circuit diagram showing an example of the constant voltage circuit 1.

The constant voltage circuit 1 further includes the second gain stage 50.

The second gain stage 50 includes the PMOS transistors P7 to P9 and the NMOS transistor N12.

One end of the PMOS transistor P7 is coupled to the node ND1, the other end is coupled to a node ND39, and a gate is coupled to the node ND33. That is, the PMOS transistors P4 and P7 form a current mirror. The current I5a corresponding to the current I1c flows through the PMOS transistor P7.

One end of the PMOS transistor P8 is coupled to the node ND1, the other end is coupled to a node ND38, and a gate is coupled to the node ND33. That is, the PMOS transistors P4 and P8 form a current mirror.

One end of the PMOS transistor P9 is coupled to the node ND38, the other end is coupled to the node ND39, and a gate is coupled to the node ND10. The PMOS transistor P9 operates based on the voltage Vnd10 of the node ND10.

For example, the PMOS transistor P9 is turned to the ON state in the case of the voltage Vnd10 being at the "L" level, and is turned to the OFF state in the case of the voltage Vnd10 being at the "H" level. With the PMOS transistor P9 being in the ON state, the current I5b corresponding to the current I1c flows through the PMOS transistors P8 and P9.

One end of the NMOS transistor N12 is coupled to the node ND39, and the other end is coupled to the node ND2. The node ND32 is coupled to a gate of the NMOS transistor N12. In other words, the output voltage V1 of the first gain stage 10 is applied to the gate of the NMOS transistor N12.

The node ND39 is coupled to the gate of the PMOS transistor Pp of the output stage 20. In other words, the output voltage V2 of the second gain stage 50 is applied to the gate of the PMOS transistor Pp.

The reference voltage VREF is applied to the gate of the PMOS transistor P1.

The voltage VFB is applied to the gate of the PMOS transistor P2.

The rest of the configuration of the constant voltage circuit 1 is similar to that of FIG. 22 according to the twelfth embodiment.

For example, in the case of the voltage Vnd10 being at the "L" level, only one of the PMOS transistors P6 and P9 may be turned to the ON state.

Furthermore, the PMOS transistor P7 may be eliminated from the second gain stage 50, so that another current source, another PMOS transistor, and the PMOS transistor P8 may form a current mirror. In this case, each of the PMOS transistors Tp8 and Tp9 of the first voltage monitor circuit 30, and the PMOS transistor of the first gain stage 10 may form a current mirror, or each of the PMOS transistors Tp8 and Tp9 of the first voltage monitor circuit 30, and the PMOS transistor of the second gain stage 50 may form a current mirror.

13.2 Mode Selection Operation

The mode selection operation of the constant voltage circuit 1 according to the present embodiment will be described. The flowchart illustrating the mode selection operation of the constant voltage circuit 1 according to the present embodiment corresponds to those in FIGS. 2 and 3 according to the first embodiment modified by replacing "'H' level" in S12, "N5" in S13 and S17, and "'L' level" in S16 with "'L' level", "P6 and P9", and "'H' level", respectively.

13.3 Advantageous Effect

The configuration according to the present embodiment produces the advantageous effect similar to that of the third embodiment. As a matter of course, the present embodiment is applicable to the second embodiment.

14. Fourteenth Embodiment

The constant voltage circuit 1 according to a fourteenth embodiment will be described. The constant voltage circuit 1 according to the present embodiment differs from the twelfth embodiment in terms of the configuration of the first gain stage 10 and the first voltage monitor circuit 30. In order to distinguish from the twelfth embodiment, the first voltage monitor circuit 30 will be referred to as a first voltage monitor circuit 30a. Hereinafter, the following description will in principle concentrate on the features different from the twelfth embodiment.

14.1 Circuit Configuration of Constant Voltage Circuit 1

The circuit configuration of the constant voltage circuit 1 according to the present embodiment will be described with reference to FIG. 24. FIG. 24 is a circuit diagram showing an example of the constant voltage circuit 1.

The PMOS transistors P4 and P5 and the current source 12 shown in FIG. 22 according to the twelfth embodiment are eliminated from the first gain stage 10.

The PMOS transistor Tp9 shown in FIG. 22 according to the twelfth embodiment is eliminated from the first voltage monitor circuit 30a. The first voltage monitor circuit 30a further includes the current source 33.

The voltage VIN is applied to one end of the current source 33. The other end of the current source 33 is coupled to a node ND40. One end and the gate of the NMOS transistor Tn15 are coupled to the node ND40, and the other end is coupled to the node ND2. The current I3d flows from the current source 33 to the node ND2 through the NMOS transistor Tn15. The gate of the NMOS transistor Tn2 is coupled to the node ND40. That is, the NMOS transistors Tn15 and Tn2 form a current mirror. The current I3c corresponding to the current I3d flows through the NMOS transistor Tn2.

The PMOS transistor Tp8 in FIG. 22 according to the twelfth embodiment is eliminated from the first current comparator 32. The first current comparator 32 further includes PMOS transistors Tp10-1 to Tp10-s (where s is an integer greater than or equal to 1) and Tp11-1 to Tp11-s, and the current source 34.

The PMOS transistors Tp10-1 to Tp10-s are coupled in series. One end of the PMOS transistors Tp10-1 to Tp10-s coupled in series is coupled to the node ND1. The other end of the PMOS transistors Tp10-1 to Tp10-s is coupled in series is coupled to the node ND35. Each of gates of the PMOS transistors Tp10-1 to Tp10-s is coupled to the node ND35.

One end of the current source 34 is coupled to the node ND35, and the other end is coupled to the node ND2. The current I3e flows from the current source 34.

The PMOS transistors Tp11-1 to Tp11-s are coupled in series. One end of the PMOS transistors Tp11-1 to Tp11-s coupled in series is coupled to the node ND1. The other end of the PMOS transistors Tp11-1 to Tp11-s coupled in series is coupled to the node ND10. Each of gates of the PMOS transistors Tp11-1 to Tp11-s is coupled to the node ND35. That is, the PMOS transistors Tp10-1 to Tp10-s and the PMOS transistors Tp11-1 to Tp11-s form the current mirror. The current I3b corresponding to the current I3e flows through the PMOS transistors Tp11-1 to Tp11-s. Since the PMOS transistors Tp11-1 to Tp11-s are coupled in series, the current I3b is high in constant current characteristic.

In the first current comparator 32, the NMOS transistor Tn13 is made shorter in gate length L than the NMOS transistor Tn14. In this case, the channel-length modulation effects of the NMOS transistor Tn13 cause the current I3ac to rise more than in the case in which the gate length L is long. When the current I3ac rises, the voltage Vnd10 of the node ND10 drops. On the other hand, when the voltage Vnd10 drops, the current I3b drops. Therefore, the voltage Vnd10 drops gradually. In other words, the first current comparator 32 slowly changes the voltage Vnd10 of the node ND10. Accordingly, the voltage Vnd10 takes a voltage value ranging between the voltage VSS and the voltage VIN. As the amount of drop in output voltage VOUT becomes larger, the voltage Vnd10 becomes greater. As the amount of drop in output voltage VOUT becomes smaller, the voltage Vnd10 becomes smaller. In the case where the current I3ac does not flow, the voltage Vnd10 is set to a voltage approximate to the voltage VIN.

The PMOS transistor P6 is turned to the ON state when the voltage Vnd10 exceeds the threshold voltage Vth6 of the PMOS transistor P6, so that the current I1b corresponding to the voltage Vnd10 flows through the first gain stage 10.

The rest of the configuration of the constant voltage circuit 1 is similar to that of FIG. 22 according to the twelfth embodiment.

14.2 Mode Selection Operation

The mode selection operation of the constant voltage circuit 1 according to the present embodiment will be described. The flowchart illustrating the mode selection operation of the constant voltage circuit 1 according to the present embodiment corresponds to those in FIG. 10 and FIG. 11 according to the fourth embodiment modified by replacing "Vth5" in S41 and S43 with "Vth6".

14.3 Advantageous Effect

The configuration according to the present embodiment produces an advantageous effect similar to that described in the fourth embodiment.

15. Fifteenth Embodiment

The constant voltage circuit 1 according to a fifteenth embodiment will be described. The constant voltage circuit 1 according to the present embodiment differs from the fourteenth embodiment in terms of the configuration of the first gain stage 10 and the first current comparator 32. The flowchart showing the mode selection operation is similar to that of the fourteenth embodiment. Hereinafter, the following description will in principle concentrate on the features different from the fourteenth embodiment.

15.1 Circuit Configuration of Constant Voltage Circuit 1

The circuit configuration of the constant voltage circuit 1 according to the present embodiment will be described with reference to FIG. 25. FIG. 25 is a circuit diagram showing an example of the constant voltage circuit 1.

The PMOS transistor P6 shown in FIG. 24 according to the fourteenth embodiment is eliminated from the first gain stage 10. The first gain stage 10 further includes the PMOS transistors P6-1 to P6-t (where t is an integer greater than or equal to 1).

The PMOS transistors P6-1 to P6-t are coupled in series. One end of the PMOS transistors P6-1 to P6-t coupled in series is coupled to the node ND1. The other end of the PMOS transistors P6-1 to P6-t coupled in series is coupled to the node ND30. Each of gates of the PMOS transistors P6-1 to P6-t is coupled to the node ND10. Each of the PMOS transistors P6-1 to P6-t operates based on the voltage Vnd10 of the node ND10. Since the PMOS transistors P6-1 to P6-t are coupled in series, the current I1b decreases in gain. That is, the current I1b becomes smaller than in the case in which the PMOS transistors P6-1 to P6-t are not coupled in series.

The PMOS transistors Tp10-1 to Tp10-s and Tp11-1 to Tp11-s, and the current source 34 shown in FIG. 24 according to the fourteenth embodiment are eliminated from the first current comparator 32. The first current comparator 32 further includes the resistance element R1.

One end of the resistance element R1 is coupled to the node ND1, and the other end is coupled to the node ND10. The resistance element R1 may be a variable resistance.

In the first current comparator 32, the current I3ac obtained by multiplying the current I3ac' which flows through the NMOS transistor Tn14 by a mirror ratio, flows through the NMOS transistor Tn13. By this, the first current comparator 32 slowly changes the voltage Vnd10 of the node ND10. Accordingly, the voltage Vnd10 takes a voltage value ranging between the voltage VSS and the voltage VIN. As the amount of drop in output voltage VOUT becomes larger, the voltage Vnd10 becomes greater. As the amount of drop in output voltage VOUT becomes smaller, the voltage Vnd10 becomes smaller.

Each of the PMOS transistors P6-1 to P6-t is turned to the ON state when the voltage Vnd10 exceeds the threshold voltage Vth6 of each of the PMOS transistors P6-1 to P6-t, so that the current I1b corresponding to the voltage Vnd10 flows through the first gain stage 10.

The rest of the configuration of the constant voltage circuit 1 is similar to that of FIG. 24 according to the fourteenth embodiment.

15.2 Advantageous Effect

The configuration according to the present embodiment produces an advantageous effect similar to that of the fifth embodiment.

16. Sixteenth Embodiment

The constant voltage circuit 1 according to a sixteenth embodiment will be described. The constant voltage circuit 1 according to the present embodiment differs from the fourteenth embodiment in terms of the configuration of the first gain stage 10 and the first voltage monitor circuit 30a. Hereinafter, the following description will in principle concentrate on the features different from the fourteenth embodiment.

16.1 Circuit Configuration of Constant Voltage Circuit 1

The circuit configuration of the constant voltage circuit 1 according to the present embodiment will be described with reference to FIG. 26. FIG. 26 is a circuit diagram showing an example of the constant voltage circuit 1.

The first current comparator 32 and the NMOS transistor Tn14 shown in FIG. 24 according to the fourteenth embodiment are eliminated from the first voltage monitor circuit 30a.

One end of the PMOS transistor Tp7 is coupled to the node ND1, the other end is coupled to the node ND30, and the gate is coupled to the node ND11.

In the first voltage monitor circuit 30a, the current I3ac obtained by multiplying the current I3a which flows through the PMOS transistor Tp1 by a mirror ratio, flows through the PMOS transistor Tp7. As the amount of drop in output voltage VOUT becomes larger, the current I3ac becomes greater. As the amount of drop in output voltage VOUT becomes smaller, the current I3ac becomes smaller. The current I3ac flows from the node ND1 through the PMOS transistor Tp7 to the node ND30. That is, the current I3ac obtained by multiplying the current I3a by the mirror ratio, flows through the first gain stage 10.

The rest of the configuration of the constant voltage circuit 1 is similar to that of FIG. 24 according to the fourteenth embodiment.

16.2 Mode Selection Operation

The mode selection operation of the constant voltage circuit 1 according to the present embodiment will be described. The flowchart showing the mode selection operation of the constant voltage circuit 1 according to the present embodiment differs from those of FIG. 10 and FIG. 11 according to the fourth embodiment in that S41 and S43 are replaced with the operation described below. Hereinafter, the mode selection operation of the constant voltage circuit 1 will be described with reference to FIG. 10 and FIG. 11.

In S41 shown in FIG. 10, in the case of the PMOS transistor Tp7 being in the ON state (S41_Yes), the constant voltage circuit 1 sets the operation current of the first gain stage 10 to be the variable value (current I1a+I3ac) (S42). On the other hand, in the case of the PMOS transistor Tp7 being in the OFF state (S41_No), the constant voltage circuit 1 maintains the operation current of the first gain stage 10 to the constant value (current I1a).

In S43 shown in FIG. 11, in the case of the PMOS transistor Tp7 being in the ON state (S43_Yes), the constant voltage circuit 1 maintains the operation current of the first gain stage 10 to the variable value (current I1a+I3ac). On the other hand, in the case of the PMOS transistor Tp7 being in the OFF state (S43_No), the constant voltage circuit 1 sets the operation current of the first gain stage 10 to the constant value (current I1a) (S44).

The rest of the mode selection operation is similar to that of FIG. 10 and FIG. 11 according to the fourth embodiment.

16.3 Advantageous Effect

The configuration according to the present embodiment produces an advantageous effect similar to that of the sixth embodiment.

17. Seventeenth Embodiment

The constant voltage circuit 1 according to a seventeenth embodiment will be described. The constant voltage circuit 1 according to the present embodiment differs from the fourteenth embodiment in terms of including the second gain stage 50. Hereinafter, the following description will in principle concentrate on the features different from the fourteenth embodiment.

17.1 Circuit Configuration of Constant Voltage Circuit 1

The circuit configuration of the constant voltage circuit 1 according to the present embodiment will be described with reference to FIG. 27. FIG. 27 is a circuit diagram showing an example of the constant voltage circuit 1.

The constant voltage circuit 1 further includes the second gain stage 50.

The PMOS transistors P7 and P8 shown in FIG. 23 according to the thirteenth embodiment are eliminated from the second gain stage 50. The second gain stage 50 further includes the current source 51.

One end of the current source 51 is coupled to the node ND1, and the other end is coupled to the node ND39. The current I5a flows from the current source 51 to the node ND39.

The rest of the configuration of the second gain stage 50 is similar to that of FIG. 23 according to the thirteenth embodiment.

The rest of the configuration of the constant voltage circuit 1 is similar to that of FIG. 24 according to the fourteenth embodiment.

The first voltage monitor circuit 30a may be the first voltage monitor circuit 30a according to the fifteenth embodiment or the sixteenth embodiment.

17.2 Mode Selection Operation

The mode selection operation of the constant voltage circuit 1 according to the present embodiment will be described. The flowchart showing the mode selection operation of the constant voltage circuit 1 according to the present embodiment differs from those of FIG. 10 and FIG. 11 according to the fourth embodiment in that the operation of the second gain stage 50 is added. Hereinafter, the mode selection operation of the constant voltage circuit 1 will be described with reference to FIG. 10 and FIG. 11.

In S40 shown in FIG. 10, the constant voltage circuit 1 sets the operation current of the first gain stage 10 to the constant value (current I1a) and sets the operation current of the second gain stage 50 to the constant value (current I5a).

In S41 shown in FIG. 10, in the case of the voltage Vnd10 being greater than the threshold voltage Vth6 of the PMOS transistor P6 or being greater than the threshold voltage Vth9 of the PMOS transistor P9 (S41_Yes), one of the PMOS transistors P6 and P9, which exceeds the threshold voltage, is turned to the ON state. As a result, the constant voltage circuit 1 sets the operation current of the first gain stage 10 to the variable value (current I1a+I1b) and sets the operation current of the second gain stage 50 to the variable value (current I5a+I5b) (S42). On the other hand, in the case of the voltage Vnd10 being smaller than or equal to both of the threshold voltage Vth6 and the threshold voltage Vth9 (S41_No), the PMOS transistors P6 and P9 maintain the OFF state. That is, the constant voltage circuit 1 maintains the operation current of the first gain stage 10 at the constant value (current I1a) and maintains the operation current of the second gain stage 50 at the constant value (current I5a).

In S43 shown in FIG. 11, in the case of the voltage Vnd10 being greater than the threshold voltage Vth6 of the PMOS transistor P6 or being greater than the threshold voltage Vth9 of the PMOS transistor P9 (S43_Yes), one of the PMOS transistors P6 and P9, which exceeds the threshold voltage, maintains the ON state. That is, the constant voltage circuit 1 maintains the operation current of the first gain stage 10 at the variable value (current I1a+I1b) and the operation current of the second gain stage 50 at the variable value (current I5a+I5b). On the other hand, in the case of the voltage Vnd10 being smaller than or equal to both of the threshold voltage Vth6 and the threshold voltage Vth9 (S43_No), the PMOS transistors P6 and P9 maintain the OFF state. As a result, the constant voltage circuit 1 sets the operation current of the first gain stage 10 to the constant value (current I1a) and sets the operation current of the second gain stage 50 to the constant value (current I5a) (S44).

17.3 Advantageous Effect

The configuration according to the present embodiment produces an advantageous effect similar to that of the seventh embodiment.

18. Eighteenth Embodiment

The constant voltage circuit 1 according to an eighteenth embodiment will be described. The constant voltage circuit 1 according to the present embodiment differs from the twelfth embodiment in terms of including the second voltage monitor circuit 60. The constant voltage circuit 1 according to the present embodiment differs from the twelfth embodiment in terms of the configuration of the first gain stage 10. Hereinafter, the following description will in principle concentrate on the features different from the twelfth embodiment.

18.1 Circuit Configuration of Constant Voltage Circuit 1

Figure 28:
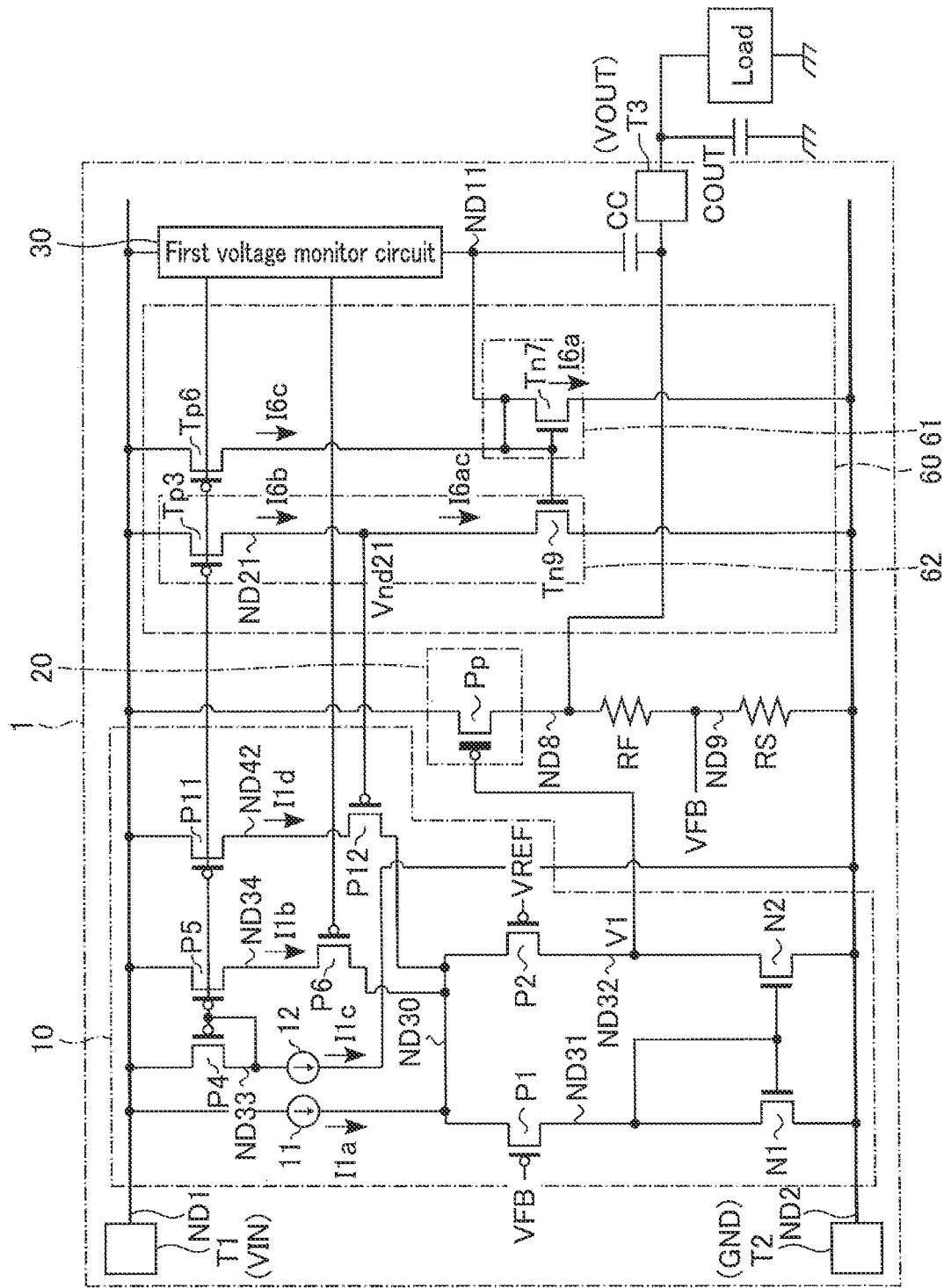
FIG. 28 is a circuit diagram showing an example of a constant voltage circuit according to an eighteenth embodiment.

The circuit configuration of the constant voltage circuit 1 according to the present embodiment will be described with reference to FIG. 28. FIG. 28 is a circuit diagram showing an example of the constant voltage circuit 1. FIG. 28 omits the interconnect between the first voltage monitor circuit 30 shown in FIG. 22 according to the twelfth embodiment and the nodes ND1 and ND2.

The constant voltage circuit 1 further includes the second voltage monitor circuit 60.

The voltage monitor circuit 60 includes the second voltage-current conversion circuit 61, the second current comparator 62, and the PMOS transistor Tp6.

The second voltage-current conversion circuit 61 includes the NMOS transistor Tn7.

One end and the gate of the NMOS transistor Tn7 are coupled to the node ND11, and the other end is coupled to the node ND2.

The second current comparator 62 includes the PMOS transistor Tp3 and the NMOS transistor Tn9.

One end of the PMOS transistor Tp3 is coupled to the node ND1, the other end is coupled to the node ND21, and the gate is coupled to the node ND33. That is, the PMOS transistors P4 and Tp3 form a current mirror.

One end of the NMOS transistor Tn9 is coupled to the node ND21, the other end is coupled to the node ND2, and the gate is coupled to the node ND11. That is, the NMOS transistors Tn7 and Tn9 form a current mirror.

For example, in the case where there is no fluctuation in the AC component of the output voltage VOUT or the rise in the AC component of the output voltage VOUT is slow, the current I6a does not flow or the micro current I6a flows through the NMOS transistor Tn7. In the case where the current I6a does not flow, the NMOS transistor Tn9 is turned to the OFF state, so that the current I1iac corresponding to the current I6a does not flow through the NMOS transistor Tn9. On the other hand, the current I6b corresponding to the current I1c flows through the PMOS transistor Tp3. In the case where the current I6a flows, the NMOS transistor Tn9 is turned to the ON state, so that the current I6ac momentarily flows through the NMOS transistor Tn9. On the other hand, the current I6b flows through the PMOS transistor Tp3. The current I6ac and the current I6b ultimately take the same current value.

On the other hand, in the case where the AC component of the output voltage VOUT rises sharply, the current I6a flows through the NMOS transistor Tn7. In this case, the NMOS transistor Tn9 is turned to the ON state, so that the current I6ac momentarily flows through the NMOS transistor Tn9. On the other hand, the current I6b flows through the PMOS transistor Tp3.

The second current comparator 62 compares the current I6ac with the current I6b.

In the case where the current I6ac does not flow, the voltage Vnd21 is set to a voltage approximate to the voltage VIN (is set to the "H" level). In other words, the second current comparator 62 sets the voltage Vnd21 to the "H" level.

In the case where the current I6ac flows and it is greater than the current I6b, the voltage Vnd21 drops. Thus, in this case, the voltage Vnd21 is set to a voltage approximate to the voltage VSS (is set to the "L" level). In other words, the second current comparator 62 sets the voltage Vnd21 to the "L" level. This is the case in which, for example, the AC component of the output voltage VOUT rises sharply. In the case where the current I6ac flows and it is smaller than the current I6b, the voltage Vnd21 rises. Thus, in this case, the voltage Vnd21 is set to a voltage approximate to the voltage VIN (is set to the "H" level). In other words, the second current comparator 62 sets the voltage Vnd21 to the "H" level. This is the case in which, for example, there is no fluctuation in the AC component of the output voltage VOUT or the rise in the AC component of the output voltage VOUT is slow. Furthermore, in the case where the current I1iac flows and it is equal to the current I6b, the voltage Vnd21 is maintained as a voltage approximate to the voltage VIN (maintained at the "H" level). In other words, the second current comparator 62 maintains the voltage Vnd21 at the "H" level.

One end of the PMOS transistor Tp6 is coupled to the node ND1, the other end is coupled to the node ND11, and the gate is coupled to the node ND33. That is, the PMOS transistors P4 and Tp6 form a current mirror.

The current I6c corresponding to the current I1c flows through the PMOS transistor Tp6. This results in the current I6a being biased by the current I6c.

The first gain stage 10 further includes the PMOS transistors P11 and P12.

One end of the PMOS transistor P11 is coupled to the node ND1, the other end is coupled to a node ND42, and a gate is coupled to the node ND33. That is, the PMOS transistors P4 and P11 form a current mirror.

One end of the PMOS transistor P12 is coupled to the node ND42, the other end is coupled to the node ND30, and a gate is coupled to the node ND21. The PMOS transistor P12 operates based on the voltage Vnd21 of the node ND21.

For example, the voltage Vnd21 is set to the "L" level in the case of the high-speed response mode and is set to the "H" level in the case of the low current consumption mode. For example, the PMOS transistor P12 is turned to the ON state in the case of the voltage Vnd21 being at the "L" level, and is turned to the OFF state in the case of the voltage Vnd21 being at the "H" level. With the PMOS transistor P12 being in the ON state, the current I1d corresponding to the current I1c flows through the PMOS transistors P11 and P12.

18.2 Mode Selection Operation

The mode selection operation of the constant voltage circuit 1 according to the present embodiment will be described. The flowchart illustrating the mode selection operation of the constant voltage circuit 1 according to the present embodiment corresponds to those in FIGS. 16 and 17 according to the eighth embodiment modified by replacing "'H' level" in S12, "N5" in S13 and S17, and "'L' level" in S16 with "'L' level", "P6", and "'H' level", respectively. In addition, in this flowchart, 'H' level" in S51, "N11" in S52 and S56, and "'L' level" in S55 in the flowcharts FIG. 16 and FIG. 17 according to the eighth embodiment are replaced with "'L' level", "P12", and "'H' level", respectively.

18.3 Advantageous Effect

The configuration according to the present embodiment produces an advantageous effect similar to that of the eighth embodiment. As a matter of course, the present embodiment is applicable to the second embodiment.

19. Modifications, Etc

As described in the above, a constant voltage circuit according to the embodiments includes a first gain stage (10) configured to output a first voltage (V1) obtained by amplifying a difference between a reference voltage (VREF) and a divided voltage (VFB) obtained by dividing an output voltage (VOUT); a first transistor (Pp) having a first end, a second end, and a gate, the first end being coupled to an input voltage terminal (T1), the second end being coupled to an output voltage terminal (T3), the first transistor (Pp) being configured to control the output voltage (VOUT) based on the first voltage (V1) applied to the gate; a second transistor (N5/P6) configured to control a current that flows through the first gain stage (10); a first circuit (31) configured to convert an amount of fluctuation in the output voltage (VOUT) into a first current (I3a), and a second circuit (32) configured to control a gate voltage of the second transistor (N5/P6) based on a second current (I3ac) corresponding to the first current (I3a). In a case where the gate voltage of the second transistor (N5/P6) is smaller than or equal to a first threshold voltage of the second transistor, a first operation mode (low current consumption mode) is selected, so that a third current (I1a) flows through the first gain stage (10), and in a case where the gate voltage of the second transistor is greater than the first threshold voltage, a second operation mode (high-speed response mode) is selected, so that a fourth current (I1a+I1b) greater than the third current flows through the first gain stage.

The embodiments are not limited to those described in the above, and various modifications can be made.

the order of the steps in the above-described flowchart may be altered in any manner possible.

The first voltage monitor circuit 30 according to the eighteenth embodiment may be the first voltage monitor circuit 30a according to the fourteenth embodiment, the fifteenth embodiment, or the sixteenth embodiment. The second monitor circuit 60 according to the eighteenth embodiment may have a similar configuration to that of the second voltage monitor circuit 60a according to the ninth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A constant voltage circuit comprising:
   a first gain stage configured to output a first voltage obtained by amplifying a difference between a reference voltage and a divided voltage obtained by dividing an output voltage;
   a first transistor having a first end, a second end, and a gate, the first end being coupled to an input voltage terminal, the second end being coupled to an output voltage terminal, the first transistor being configured to control the output voltage based on the first voltage applied to the gate;
   a second transistor configured to control a current that flows through the first gain stage;
   a first circuit configured to convert an amount of fluctuation in the output voltage into a first current; and
   a second circuit configured to control a gate voltage of the second transistor based on a second current corresponding to the first current,
   wherein in a case where the gate voltage of the second transistor is smaller than or equal to a first threshold voltage of the second transistor, a first operation mode is selected, so that a third current flows through the first gain stage, and in a case where the gate voltage of the second transistor is greater than the first threshold voltage, a second operation mode is selected, so that a fourth current greater than the third current flows through the first gain stage.

2. The constant voltage circuit according to claim 1, wherein the first circuit includes a third transistor having a first end, a second end, and a gate, the first end being coupled to the input voltage terminal, and the second end and the gate being coupled to the output voltage terminal, the third transistor being configured to allow the first current to flow, the second circuit includes:
   a fourth transistor having a first end, a second end, and a gate, the first end being coupled to the input voltage terminal, the second end being coupled to the gate of the second transistor, the gate being coupled to the output voltage terminal, the fourth transistor being configured to allow the second current to flow; and
   a fifth transistor having a first end and a second end, the first end being coupled to the gate of the second transistor, the second end being coupled to a ground voltage terminal, the fifth transistor being configured to allow a fifth current to flow, and
   the second circuit sets, based on the second current and the fifth current, the gate voltage of the second transistor to a first logic level smaller than the first threshold voltage of the second transistor or a second logic level greater than the first threshold voltage of the second transistor.

3. The constant voltage circuit according to claim 2, further comprising a third circuit configured to control a second voltage based on a current difference between a threshold current and a sixth current corresponding to a current flowing through the first transistor,
wherein in a case where the second voltage and a voltage of the second end of the fourth transistor are at the first logic level, the first operation mode is selected, so that the third current flows through the first gain stage, and
in a case where at least one of the second voltage or the voltage of the second end of the fourth transistor is at the second logic level, the second operation mode is selected, so that the fourth current flows through the first gain stage.

4. The constant voltage circuit according to claim 1, wherein the first circuit includes a third transistor having a first end, a second end, and a gate, the first end being coupled to the input voltage terminal, the second end and the gate being coupled to the output voltage terminal, the third transistor being configured to allow the first current to flow,
the second circuit includes a fourth transistor having a first end, a second end, and a gate, the first end being coupled to the input voltage terminal, the second end being coupled to the gate of the second transistor, the gate being coupled to the output voltage terminal, the fourth transistor being configured to allow the second current to flow, and
the second circuit sets the gate voltage of the second transistor to a voltage value ranging between a ground voltage and a voltage of the input voltage terminal, based on the second current.

5. The constant voltage circuit according to claim 4, wherein the second circuit sets the gate voltage of the second transistor in such a manner that the gate voltage becomes greater as the amount of fluctuation in the output voltage becomes larger, and the gate voltage becomes smaller as the amount of fluctuation in the output voltage becomes smaller.

6. The constant voltage circuit according to claim 1, further comprising:
a sixth transistor configured to control a current that flows through the first gain stage;
a fourth circuit configured to convert the amount of fluctuation in the output voltage into a seventh current; and
a fifth circuit configured to control a gate voltage of the sixth transistor based on an eighth current corresponding to the seventh current,
wherein in a case where the gate voltage of the sixth transistor is smaller than or equal to a second threshold voltage of the sixth transistor, the first operation mode is selected, so that the third current flows through the first gain stage, and
in a case where the gate voltage of the sixth transistor is greater than the second threshold voltage, the second operation mode is selected, so that a ninth current greater than the third current flows through the first gain stage.

7. The constant voltage circuit according to claim 1, wherein the first circuit converts an amount of drop in the output voltage into the first current.

8. The constant voltage circuit according to claim 1, further comprising a capacitance element having a first electrode and a second electrode, the first electrode being coupled to the first circuit, the second electrode being coupled to the output voltage terminal.

9. The constant voltage circuit according to claim 6, wherein the fourth circuit converts an amount of rise in the output voltage into the seventh current.

10. A constant voltage circuit comprising:
a first gain stage configured to output a first voltage obtained by amplifying a difference between a reference voltage and a divided voltage obtained by dividing an output voltage;
a first transistor having a first end, a second end, and a gate, the first end being coupled to an input voltage terminal, the second end being coupled to an output voltage terminal, and the first transistor being configured to control the output voltage based on the first voltage applied to the gate;
a second transistor configured to control a current that flows through the first gain stage;
a first circuit configured to convert an amount of fluctuation in the output voltage into a first current; and
a second circuit configured to control a gate voltage of the second transistor based on a second current corresponding to the first current,
wherein in a case where the gate voltage of the second transistor is smaller than or equal to a first threshold voltage of the second transistor, a current that flows through the first gain stage takes a constant value, and
in a case where the gate voltage of the second transistor is greater than the first threshold voltage, a current that flows through the first gain stage takes a variable value.

11. The constant voltage circuit according to claim 10, wherein the first circuit includes a third transistor having a first end, a second end, and a gate, the first end being coupled to the input voltage terminal, the second end and the gate being coupled to the output voltage terminal, the third transistor being configured to allow the first current to flow,
the second circuit includes a fourth transistor having a first end, a second end, and a gate, the first end being coupled to the input voltage terminal, the second end being coupled to the gate of the second transistor, the gate being coupled to the output voltage terminal, the fourth transistor being configured to allow the second current to flow, and
the second circuit sets the gate voltage of the second transistor to a voltage value ranging between a ground voltage and a voltage of the input voltage terminal, based on the second current.

12. The constant voltage circuit according to claim 11, wherein the second circuit sets the gate voltage of the second transistor in such a manner that a voltage value of the gate voltage of the second transistor becomes greater as the amount of fluctuation in the output voltage becomes larger, and the voltage value of the gate voltage of the second transistor becomes smaller as the amount of fluctuation in the output voltage becomes smaller.

13. A constant voltage circuit comprising:
a first gain stage configured to output a first voltage obtained by amplifying a difference between a reference voltage and a divided voltage obtained by dividing an output voltage;
a second gain stage configured to output a second voltage obtained by amplifying the first voltage;
a first transistor having a first end, a second end, and a gate, the first end being coupled to an input voltage terminal, the second end being coupled to an output voltage terminal, the first transistor being configured to control the output voltage based on the second voltage applied to the gate;
a second transistor configured to control a current that flows through the first gain stage;
a third transistor configured to control a current that flows through the second gain stage;
a first circuit configured to convert an amount of fluctuation in the output voltage into a first current; and
a second circuit configured to control a gate voltage of each of the second transistor and the third transistor based on a second current corresponding to the first current,
wherein in a case where the gate voltage of the second transistor is smaller than or equal to a first threshold voltage of the second transistor, a first operation mode is selected, so that a third current flows through the first gain stage, and in a case where the gate voltage of the second transistor is greater than the first threshold voltage, a second operation mode is selected, so that a fourth current greater than the third current flows through the first gain stage, and
in a case where the gate voltage of the third transistor is smaller than or equal to a second threshold voltage of the third transistor, a third operation mode is selected, so that a fifth current flows through the second gain stage, and in a case where the gate voltage of the third transistor is greater than the second threshold voltage, a fourth operation mode is selected, so that a sixth current greater than the fifth current flows through the second gain stage.

* * * * *